(12) United States Patent
Kim et al.

(10) Patent No.: US 12,471,453 B2
(45) Date of Patent: Nov. 11, 2025

(54) DISPLAY APPARATUS

(71) Applicant: Samsung Display Co., Ltd., Yongin-si (KR)

(72) Inventors: Youngdae Kim, Yongin-si (KR); Sangjin Park, Yongin-si (KR); Chadong Kim, Yongin-si (KR); Donghyun Yang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 455 days.

(21) Appl. No.: 17/899,508

(22) Filed: Aug. 30, 2022

(65) Prior Publication Data

US 2023/0064938 A1    Mar. 2, 2023

(30) Foreign Application Priority Data

Aug. 31, 2021 (KR) .......................... 10-2021-0115701

(51) Int. Cl.
*H10K 59/124* (2023.01)
*H10D 86/40* (2025.01)
*H10D 86/60* (2025.01)
*H10K 59/121* (2023.01)

(52) U.S. Cl.
CPC .......... *H10K 59/124* (2023.02); *H10D 86/451* (2025.01); *H10D 86/60* (2025.01); *H10K 59/1213* (2023.02)

(58) Field of Classification Search
CPC ............. H01L 27/1248; H01L 27/1225; H10K 59/124; H10D 86/60
See application file for complete search history.

(56) References Cited

U.S. PATENT DOCUMENTS

| | | | |
|---|---|---|---|
| 9,812,518 B2 | 11/2017 | Kim | |
| 10,868,096 B2 | 12/2020 | Park et al. | |
| 10,921,857 B2 | 2/2021 | Kim et al. | |
| 11,569,477 B2 | 1/2023 | Song et al. | |
| 2005/0023964 A1* | 2/2005 | Omura | H10K 59/8722 313/504 |

(Continued)

FOREIGN PATENT DOCUMENTS

| | | |
|---|---|---|
| KR | 10-2015-0046963 | 5/2015 |
| KR | 10-2016-0120388 | 10/2016 |

(Continued)

*Primary Examiner* — Vongsavanh Sengdara
(74) *Attorney, Agent, or Firm* — Innovation Counsel LLP

(57) ABSTRACT

A display apparatus includes a substrate, a thin film transistor, a first inorganic insulating layer, a first organic insulating layer, a second inorganic insulating layer, and a second organic insulating layer. The thin film transistor is over the substrate and includes a semiconductor layer and a gate electrode. The first inorganic insulating layer includes a first insulating layer between the semiconductor layer and the gate electrode of the thin film transistor and a second insulating layer over the gate electrode. The first organic insulating layer is over the first inorganic insulating layer. The second inorganic insulating layer is over the first organic insulating layer. The second organic insulating layer is over the second inorganic insulating layer. At least one hole passing through the first inorganic insulating layer and the second inorganic insulating layer is formed in a peripheral portion of the thin film transistor.

18 Claims, 13 Drawing Sheets

(56) References Cited

U.S. PATENT DOCUMENTS

| | | | |
|---|---|---|---|
| 2011/0227063 A1* | 9/2011 | Yun | H10D 30/6729 |
| | | | 438/34 |
| 2015/0108484 A1 | 4/2015 | Pakr et al. | |
| 2019/0267440 A1* | 8/2019 | Park | H10K 59/1216 |
| 2021/0202633 A1* | 7/2021 | Song | G09G 5/00 |

FOREIGN PATENT DOCUMENTS

| | | |
|---|---|---|
| KR | 10-2018-0045929 | 5/2018 |
| KR | 10-2019-0104091 | 9/2019 |
| KR | 10-2020-0114111 | 10/2020 |
| KR | 10-2021-0046118 | 4/2021 |

* cited by examiner

DISPLAY APPARATUS

CROSS-REFERENCE TO RELATED APPLICATION

This application claims priority to and the benefit of Korean Patent Application No. 10-2021-0115701, filed Aug. 31, 2021, which is hereby incorporated by reference for all purposes as if fully set forth herein.

BACKGROUND

Field

One or more embodiments relate generally to display apparatus and, more particularly, to foldable or bendable display apparatus.

Discussion

Display apparatus are used for various purposes. Also, as display apparatus becomes thinner and lighter, their range of use is increasing. In addition to flat panel display apparatus, research has been conducted in implementing flexible display apparatus, such as foldable display apparatus and rollable display apparatus.

The above information disclosed in this section is only for understanding the background of the inventive concepts, and, therefore, may contain information that does not form prior art.

SUMMARY

One or more embodiments are capable of providing a flexible display apparatus that is flexible while being robust against external impact.

Additional aspects will be set forth in the detailed description which follows, and, in part, will be apparent from the disclosure, or may be learned by practice of the inventive concepts.

According to an embodiment, a display apparatus includes a substrate, a thin film transistor, a first inorganic insulating layer, a first organic insulating layer, a second inorganic insulating layer, and a second organic insulating layer. The thin film transistor is over the substrate and includes a semiconductor layer and a gate electrode. The first inorganic insulating layer includes a first insulating layer between the semiconductor layer and the gate electrode of the thin film transistor and a second insulating layer over the gate electrode. The first organic insulating layer is over the first inorganic insulating layer. The second inorganic insulating layer is over the first organic insulating layer. The second organic insulating layer is over the second inorganic insulating layer. At least one hole passing through the first inorganic insulating layer and the second inorganic insulating layer is formed in a peripheral portion of the thin film transistor.

According to an embodiment, a display apparatus includes a substrate, a first thin film transistor, a second thin film transistor, a first inorganic insulating layer, a first organic insulating layer, a second inorganic insulating layer, and a second organic insulating layer. The substrate includes pixel areas. The first thin film transistor is over a first pixel area among the pixel areas. The first thin film transistor includes a first semiconductor layer and a first gate electrode. The second thin film transistor is over a second pixel area adjacent to the first pixel area among the pixel areas. The second thin film transistor includes a second semiconductor layer and a second gate electrode. The first inorganic insulating layer is over the first gate electrode of the first thin film transistor and the second gate electrode of the second thin film transistor. The first organic insulating layer is over the first inorganic insulating layer. The second inorganic insulating layer is over the first organic insulating layer. The second organic insulating layer is over the second inorganic insulating layer. At least one hole passing through the first inorganic insulating layer and the second inorganic insulating layer is included in a boundary area between the first pixel area and the second pixel area.

The foregoing general description and the following detailed description are illustrative and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate embodiments of the inventive concepts, and, together with the description, serve to explain principles of the inventive concepts. In the drawings.

DETAILED DESCRIPTION OF SOME EMBODIMENTS

Figure 1A:
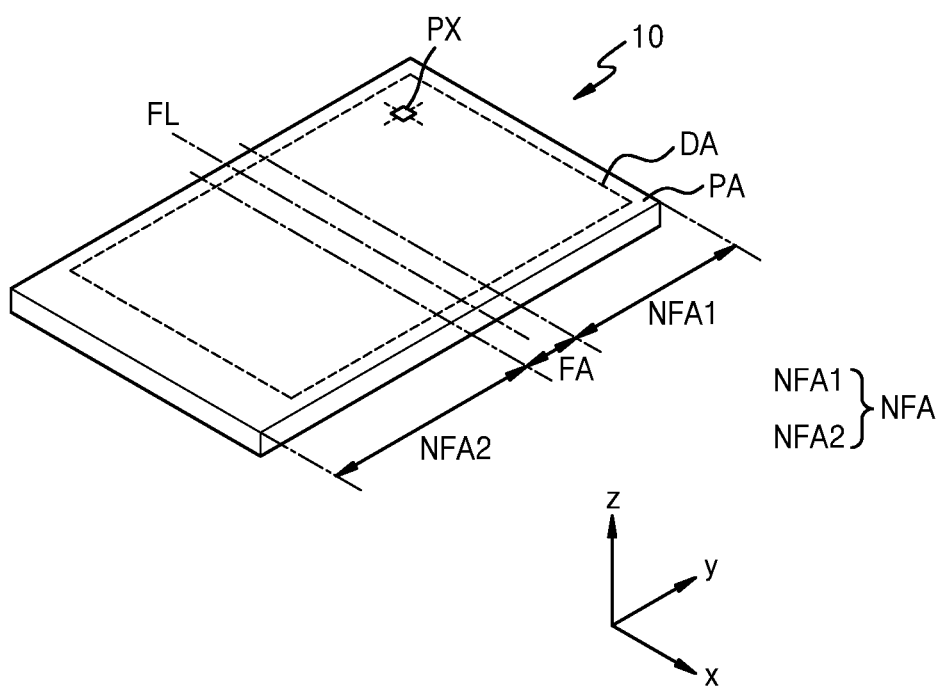
FIGS. 1A and 1B are perspective views schematically illustrating a display apparatus before being folded according to some embodiments.

In the following description, for the purposes of explanation, numerous specific details are set forth in order to provide a thorough understanding of various embodiments. As used herein, the terms "embodiments" and "implementations" may be used interchangeably and are non-limiting examples employing one or more of the inventive concepts disclosed herein. It is apparent, however, that various embodiments may be practiced without these specific details or with one or more equivalent arrangements. In other instances, well-known structures and devices are shown in block diagram form to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing example features of varying detail of some embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. In addition, the X-axis, the Y-axis, and the Z-axis are not limited to three axes of a rectangular coordinate system, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing some embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional views, isometric views, perspective views, plan views, and/or exploded illustrations that are schematic illustrations of idealized embodiments and/or intermediate structures. As such, variations from the shapes of the illustrations as a result of, for example, manufacturing techniques and/or tolerances, are to be expected. Thus, embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the inventive concepts. Further, the blocks, units, and/or modules of some embodiments may be physically combined into more complex blocks, units, and/or modules without departing from the inventive concepts.

Hereinafter, various embodiments will be explained in detail with reference to the accompanying drawings.

Figure 1B:
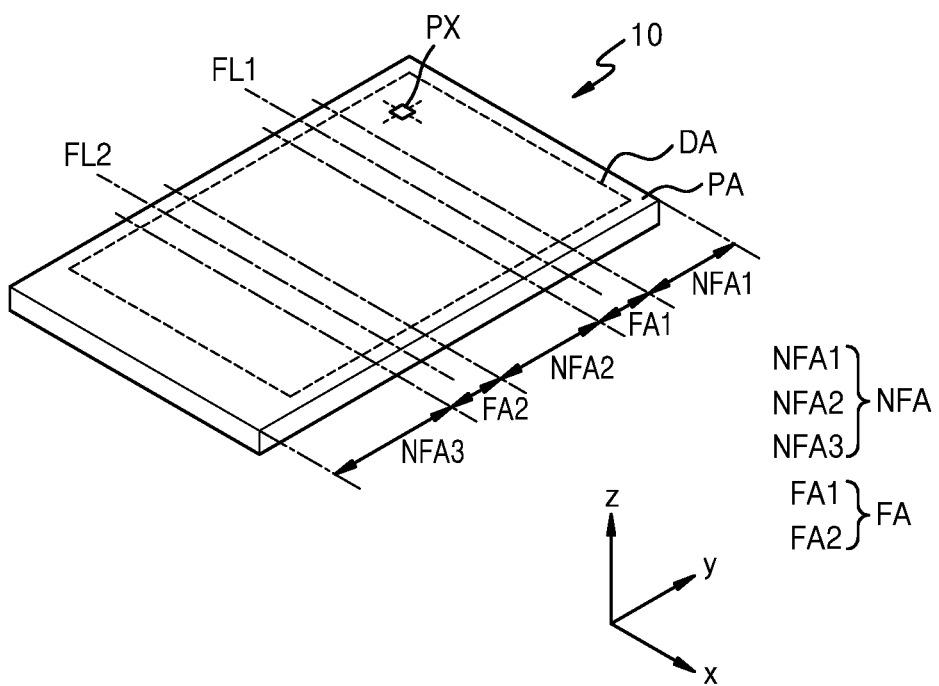
Figure 2A:
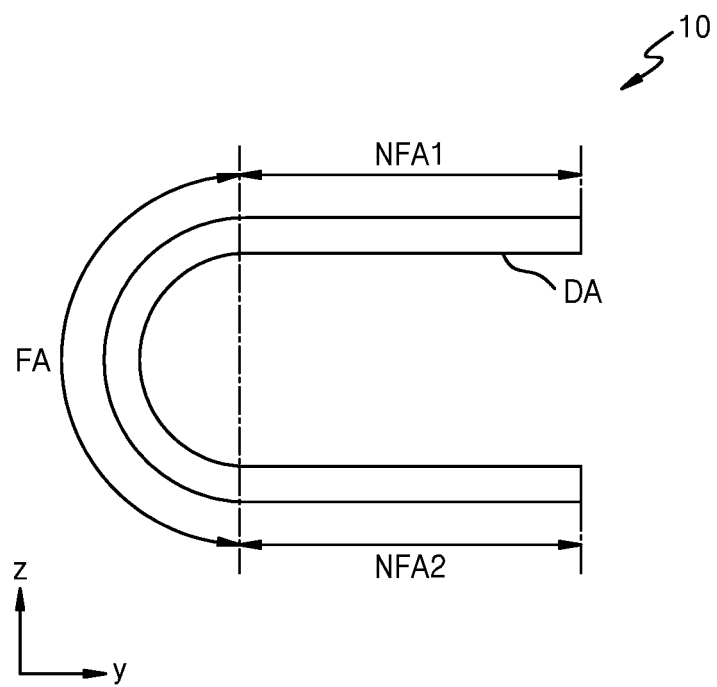
FIGS. 2A and 2B are cross-sectional views schematically illustrating a display apparatus in a folded state according to some embodiments.
Figure 2B:
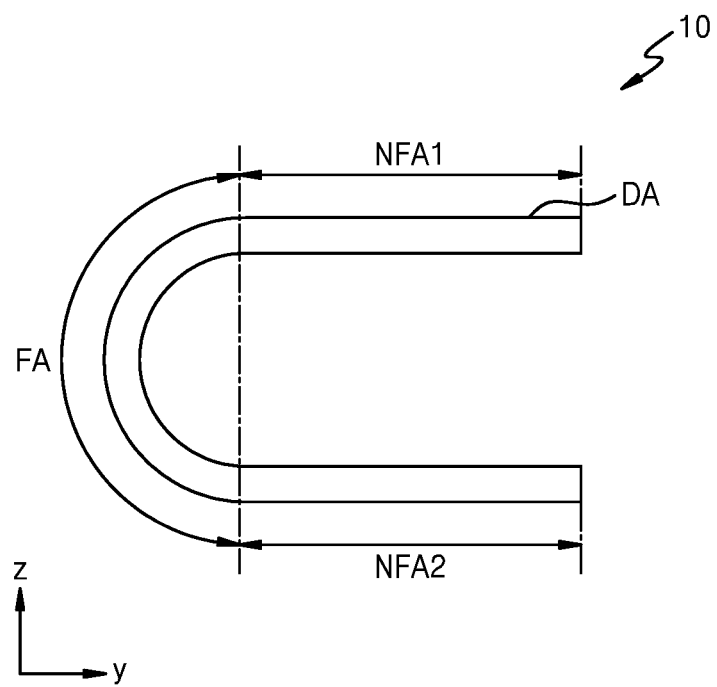

FIGS. 1A and 1B are perspective views schematically illustrating a display apparatus before being folded according to some embodiments. FIGS. 2A and 2B are cross-sectional views schematically illustrating a display apparatus in a folded state according to some embodiments.

A display apparatus according to an embodiment may be a foldable or bendable display apparatus. The display apparatus may be provided in various shapes, for example, a rectangular plate shape having two pairs of sides parallel to each other. When the display apparatus is provided in a rectangular plate shape, one pair of sides among the two pairs of sides may be longer than the other pair of sides. In an embodiment, for convenience of description, a case where the display apparatus has a rectangular shape having a pair of long sides and a pair of short sides is illustrated, the extension direction of the short sides is represented as a first direction x, the extension direction of the long sides is represented as a second direction y, and the direction perpendicular to the extension directions of the long sides and the short sides is represented as a third direction z.

The shape of the display apparatus according to an embodiment is not limited to the above shape and may include various shapes. For example, the display apparatus may be provided in various shapes, such as a closed polygon including straight sides, a circle or ellipse including curved sides, and a semicircle or semi-ellipse including straight and curved sides. In an embodiment, when the display apparatus has straight sides, at least a portion of the corner of each shape may be curved. For example, when the display apparatus has a rectangular shape, a portion where adjacent straight sides meet each other may be replaced with a curved line having a certain curvature. In this manner, a vertex portion of the rectangular shape may include a curved side having both adjacent ends connected to two adjacent straight sides and having a certain curvature. Here, the curvature may be set differently depending on the position. For example, the curvature may vary depending on the start position of a curved line and/or the length of a curved line.

Referring to FIGS. 1A, 1B, 2A, and 2B, the display apparatus may include a display panel 10. The display panel 10 may include a display area DA and a peripheral area PA outside the display area DA. The display area DA may be an area where a plurality of pixels PX are arranged to display an image. The peripheral area PA may surround the display area DA and may be a non-display area where pixels are not arranged.

Various electronic devices, printed circuit boards, and/or the like may be electrically attached to the peripheral area PA, and a voltage line and/or the like for supplying power for driving a display element may be located therein or thereon. For example, a scan driver providing a scan signal to each pixel PX, a data driver providing a data signal to each pixel PX, supply lines (e.g., clock signal lines, carry signal lines, driving voltage lines, and/or the like) for signals input to the scan driver and the data driver, and/or a main power line may be arranged in the peripheral area PA.

At least a portion of the display panel 10 may be flexible, and the display panel 10 may be folded or flexed at a flexible portion thereof. For instance, the display panel 10 may include a foldable area FA that is foldable and flexible, and a non-foldable area NFA that is non-foldable and provided on at least one side of the foldable area FA. Here, in an embodiment, an area that is not foldable will be referred to as a non-foldable area; however, this is merely for convenience of description, the expression "non-foldable" may include not only a case of being non-flexible, and thus, being rigid, but also a case of being flexible, but being less flexible than the foldable area FA and a case of being flexible, but being non-foldable. The display panel 10 may display an image in the display area DA of the foldable area FA and the non-foldable area NFA.

For convenience of description, FIG. 1A illustrates that two non-foldable areas NFA1 and NFA2 have similar areas and one foldable area FA is located between the two non-foldable areas NFA1 and NFA2; however, embodiments are not limited thereto. For example, the non-foldable areas NFA1 and NFA2 may have different areas. Also, one or more foldable areas FA may be provided as illustrated in FIG. 1B. In this case, a plurality of non-foldable areas NFA1, NFA2, and NFA3 may be provided apart from each other with foldable areas FA1 and FA2 therebetween. Each foldable area FA/FA1/FA2 may be folded with respect to a folding line FL/FL1/FL2, and the folding line FL/FL1/FL2 may be provided as a plurality of folding lines. The folding line FL/FL1/FL2 may be provided in the foldable area FA/FA1/FA2 along the second direction y that is the extension direction of the foldable area FA/FA1/FA2, and accordingly, the display panel 10 may be folded in the foldable area FA/FA1/FA2.

FIGS. 1A and 1B illustrate that the folding line FL/FL1/FL2 passes through the center of the foldable area FA/FA1/FA2 and the foldable area FA/FA1/FA2 is axially symmetrical with respect to the folding line FL/FL1/FL2; however, embodiments are not limited thereto. For instance, the folding line FL/FL1/FL2 may be asymmetrically provided in the foldable area FA/FA1/FA2. The foldable area FA/FA1/FA2 and the folding line FL/FL1/FL2 of the foldable area FA/FA1/FA2 may overlap an area of the display panel 10 where an image is displayed, and a portion displaying an image may be folded when the panel 10 is folded.

In another embodiment, the entire display panel 10 may correspond to a foldable area. For example, in the case of a display apparatus rolled like a scroll, the entire display panel 10 may correspond to a foldable area.

As illustrated in FIGS. 1A and 1*i*, the display panel 10 may be unfolded flat as a whole. In an embodiment, as illustrated in FIG. 2A, the display panel 10 may be folded with respect to the folding line FL such that the display areas DA may face each other. In another embodiment, as illustrated in FIG. 2B, the display panel 10 may be folded with respect to the folding line FL such that the display area DA may face the outside. Here, the term "folded" may mean that the shape is not fixed, but may be modified from the original shape to another shape, and may include being folded along one or more particular lines, e.g., the folding line FL, curved, or rolled like a scroll. Thus, in an embodiment, a state where the display panel 10 is folded such that the surfaces of two non-foldable areas NFA1 and NFA2 may be located parallel to each other and face each other; however, embodiments are not limited thereto. In some embodiments, the display panel 10 may be folded such that the surfaces of two non-foldable areas NFA1 and NFA2 may form a certain angle therebetween (e.g., an acute angle, a right angle, or an obtuse angle) with the foldable area FA therebetween.

Figure 3:
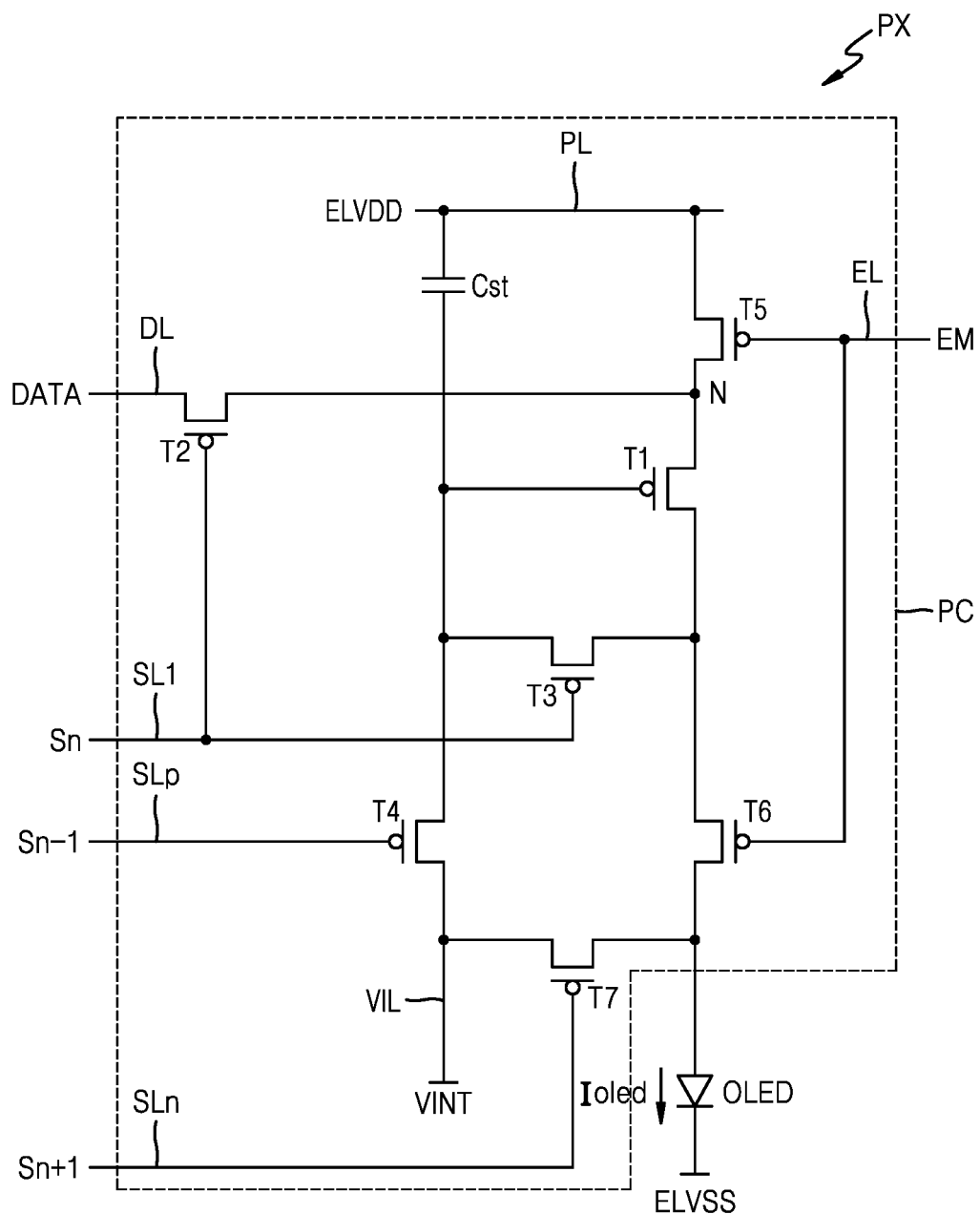
FIG. 3 is an equivalent circuit diagram schematically illustrating a pixel included in a display apparatus according to an embodiment.

FIG. 3 is an equivalent circuit diagram schematically illustrating a pixel arranged in a display panel according to an embodiment.

Referring to FIG. 3, a case where signal lines SL1, SLp, SLn, EL, and DL, an initialization voltage line VIL, and a power voltage line PL are provided for each pixel PX is illustrated. In another embodiment, at least one of the signal lines SL1, SLp, SLn, EL, and DL, the initialization voltage line VIL, and/or the power voltage line PL may be shared by adjacent pixels.

The signal lines may include a first scan line SL1 configured to transmit a first scan signal Sn, a previous scan line SLp configured to transmit a previous scan signal Sn−1, a next scan line SLn configured to transmit a next scan signal Sn+1, an emission control line EL configured to transmit an emission control signal EM, and a data line DL configured to transmit a data signal DATA.

A pixel circuit PC of the pixel PX may include a plurality of first to seventh thin film transistors T1 to T7 and a capacitor Cst. The first thin film transistor T1 may be a driving transistor, and the second to seventh thin film transistors T2 to T7 may be switching transistors.

The power voltage line PL may be configured to transmit a first power voltage ELVDD to the first thin film transistor T1, and the initialization voltage line VIL may be configured to transmit, to the pixel PX, an initialization voltage VINT for initializing the first thin film transistor T1 and an organic light emitting diode OLED.

The first scan line SL1, the previous scan line SLp, the next scan line SLn, the emission control line EL, and the initialization voltage line VIL may extend in the first direction x and may be arranged apart from each other in each row. The data line DL and the power voltage line PL may extend in the second direction y and may be arranged apart from each other in each column.

The first thin film transistor T1 may be connected to the power voltage line PL via the fifth thin film transistor T5 and may be electrically connected to the organic light emitting diode OLED via the sixth thin film transistor T6. The first thin film transistor T1 may function as a driving transistor and may receive the data signal DATA according to a switching operation of the second thin film transistor T2 to supply a driving current Ioled to the organic light emitting diode OLED.

The second thin film transistor T2 may be connected to the first scan line SL1 and the data line DL, may function as a data write transistor, and may perform a switching operation of transmitting the data signal DATA received through the data line DL to a node N by being turned on according to the first scan signal Sn received through the first scan line SL1.

The third thin film transistor T3 may be connected to the organic light emitting diode OLED via the sixth thin film transistor T6. The third thin film transistor T3 may function as a compensating transistor and may be turned on according to the first scan signal Sn received through the first scan line SL1 to diode-connect the first thin film transistor T1 to compensate for the threshold voltage of the first thin film transistor T1.

The fourth thin film transistor T4 may function as a first initialization transistor and may be turned on according to the previous scan signal Sn−1 received through the previous scan line SLp to transmit the initialization voltage VINT from the initialization voltage line VIL to the gate electrode of the first thin film transistor T1 to initialize the gate voltage of the first thin film transistor T1.

The fifth thin film transistor T5 and the sixth thin film transistor T6 may be respectively an operation control transistor and an emission control transistor and may be simultaneously turned on according to the emission control signal EM received through the emission control line EL to form a current path to allow the driving current Ioled to flow from the power voltage line PL to the organic light emitting diode OLED via the first thin film transistor T1.

The seventh thin film transistor T7 may be a second initialization transistor and may be turned on according to the next scan signal Sn+1 received through the next scan line SLn to transmit the initialization voltage VINT from the initialization voltage line VIL to the organic light emitting diode OLED to initialize the organic light emitting diode OLED. The seventh thin film transistor T7 may be omitted.

FIG. 3 illustrates a case where the fourth thin film transistor T4 is connected to the previous scan line SLp and the seventh thin film transistor T7 is connected to the next scan line SLn that is separate therefrom. In another embodiment, the seventh thin film transistor T7 may be connected to the previous scan line SLp together with the fourth thin film transistor T4.

The capacitor Cst may be connected to the power voltage line PL and the gate electrode of the first thin film transistor T1 to store and maintain a voltage corresponding to the voltage difference between both ends to maintain a voltage applied to the gate electrode of the first thin film transistor T1.

The organic light emitting diode OLED may include a pixel electrode and an opposite electrode, and the opposite electrode may receive a second power voltage ELVSS. The organic light emitting diode OLED may receive the driving current Ioled from the first thin film transistor T1 to emit light to display an image.

FIG. 3 illustrates that the first to seventh thin film transistors T1 to T7 are implemented as a p-channel metal-oxide-semiconductor field-effect transistor (MOSFET) (PMOS), but embodiments are not limited thereto. For instance, one or more of the first to seventh thin film transistors T1 to T7 may be implemented as a n-channel MOSFET (NMOS).

Figure 4:
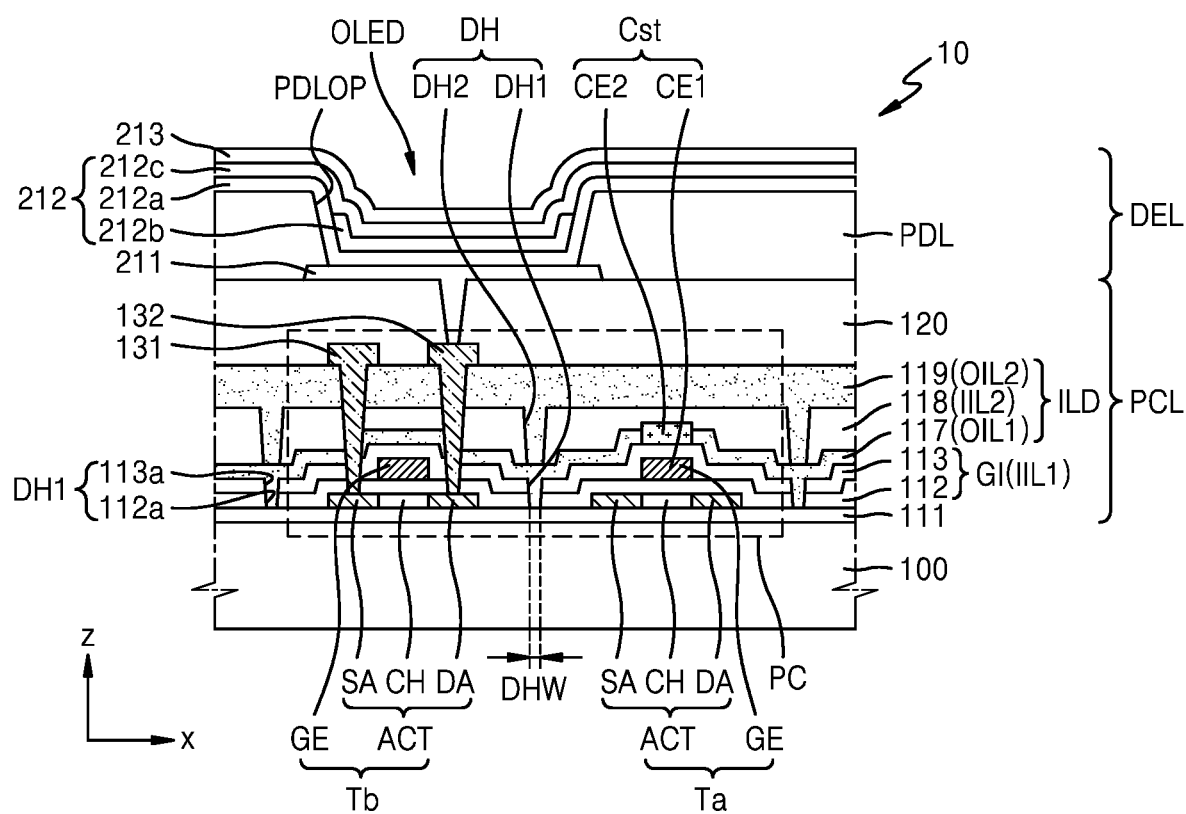
FIG. 4 is a cross-sectional view illustrating a portion of a display apparatus according to an embodiment.

FIG. 4 is a cross-sectional view illustrating a portion (e.g., a pixel portion) of a display apparatus according to an embodiment.

Referring to FIG. 4, the display apparatus may include a display panel 10, and the display panel 10 may include a substrate 100, a pixel circuit layer PCL, and a display element layer DEL. The pixel circuit layer PCL may define a pixel circuit PC. The display element layer DEL may include an organic light emitting diode OLED as a display element.

The substrate 100 may include a display area DA, and a plurality of pixels PX may be arranged in the display area DA. Each pixel PX may include an organic light emitting diode OLED as a display element and a pixel circuit PC connected to the organic light emitting diode OLED.

The substrate 100 may include at least one of a glass material, a ceramic material, a metal material, and a flexible or bendable material. When the substrate 100 has flexible or bendable characteristics, the substrate 100 may include a polymer resin, such as at least one of polyethersulfone, polyacrylate, polyetherimide, polyethylene naphthalate, polyethylene terephthalate, polyphenylene sulfide, polyarylate, polyimide, polycarbonate, and cellulose acetate propionate. The substrate 100 may have a single-layer or multiple-layer structure of the above material(s) and may further include an inorganic layer in the case of having a multiple-layer structure. In some embodiments, the substrate 100 may have an organic layer/inorganic layer/organic layer structure.

The pixel circuit PC may include at least one thin film transistor and at least one capacitor.

As illustrated in FIG. 4, the pixel circuit PC may include a driving thin film transistor Ta, a switching thin film transistor Tb, and a capacitor Cst. The driving thin film transistor Ta may be the first thin film transistor T1 included in the pixel circuit PC of FIG. 3, and the switching thin film transistor Tb may be one of the second to seventh thin film transistors T2 to T7, for example, the sixth thin film transistor T6. Hereinafter, for convenience of description, the transistors will be referred to as the driving thin film transistor Ta and the switching thin film transistor Tb.

The pixel circuit layer PCL defining the pixel circuit PC may include elements of the driving thin film transistor Ta and the switching thin film transistor Tb and a plurality of insulating layers arranged under and/or over the elements. Referring to FIG. 4, the pixel circuit layer PCL may include a first inorganic insulating layer IIL1, a first organic insulating layer OIL1, a second inorganic insulating layer IIL2, and a second organic insulating layer OIL2. At least one hole DH passing through the first inorganic insulating layer IIL1 and the second inorganic insulating layer IIL2 may be located around the driving thin film transistor Ta and the switching thin film transistor Tb.

A buffer layer 111 may be arranged over the substrate 100. The buffer layer 111 may function to increase the smoothness of the upper surface of the substrate 100, and the buffer layer 111 may include an oxide layer, such as silicon oxide (SiOx), and/or a nitride layer, such as silicon nitride (SiNx) or silicon oxynitride (SiON).

In some embodiments, a barrier layer may be further included between the substrate 100 and the buffer layer 111. The barrier layer may function to prevent or minimize the penetration of impurities from the substrate 100 or the like into a silicon semiconductor layer. The barrier layer may include an inorganic material, such as oxide or nitride, and/or an organic material and may include a single-layer or multiple-layer structure of an inorganic material and an organic material.

A gate insulating layer GI and an interlayer insulating layer ILD may be arranged over the buffer layer 111. The gate insulating layer GI may include a first gate insulating layer 112 and a second gate insulating layer 113. Each of the first gate insulating layer 112 and the second gate insulating layer 113 may include an inorganic insulating material. Hereinafter, the gate insulating layer GI will also be referred to as a first inorganic insulating layer IIL1. The interlayer insulating layer ILD may include a first interlayer insulating layer 117, a second interlayer insulating layer 118, and a third interlayer insulating layer 119. The first interlayer insulating layer 117 and the third interlayer insulating layer 119 may include an organic insulating material, and the second interlayer insulating layer 118 may include an inorganic insulating material. Hereinafter, the first interlayer insulating layer 117 will also be referred to as a first organic insulating layer OIL1, the second interlayer insulating layer 118 will also be referred to as a second inorganic insulating layer IIL2, and the third interlayer insulating layer 119 will also be referred to as a second organic insulating layer OIL2.

Each of the driving thin film transistor Ta and the switching thin film transistor Tb may include a semiconductor layer ACT and a gate electrode GE.

The semiconductor layer ACT may include a silicon semiconductor of amorphous silicon or polysilicon. The semiconductor layer ACT may include a channel area CH overlapping the gate electrode GE and a source area SA and a drain area DA arranged on both sides of the channel area CH and including impurities. Here, the impurities may include P-type impurities. The source area SA and the drain area DA may be respectively a source electrode and a drain electrode. The positions of the source area SA and the drain area DA may be interchanged with each other.

A first gate insulating layer 112 may be arranged between the semiconductor layer ACT and the gate electrode GE.

The first gate insulating layer 112 may include an inorganic material including oxide or nitride. For example, the first gate insulating layer 112 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide (ZnO).

The gate electrode GE may overlap the channel area CH. The gate electrode GE may include a low-resistance metal material. The gate electrode GE may include a conductive material including at least one of molybdenum (Mo), aluminum (Al), copper (Cu), titanium (Ti), and the like, and may include a single layer or multiple layers including the above material(s).

The second gate insulating layer 113 may cover the gate electrode GE and may be arranged over the first gate insulating layer 112. Like the first gate insulating layer 112, the second gate insulating layer 113 may include an inorganic insulating material, such as at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide (ZnO). A second electrode CE2 of the capacitor Cst may be arranged over the second gate insulating layer 113. The second electrode CE2 may overlap the gate electrode GE of the driving thin film transistor Ta thereunder. In this case, the second electrode CE2 and the gate electrode GE of the driving thin film transistor Ta overlapping each other with the second gate insulating layer 113 therebetween may form the capacitor Cst. For instance, the gate electrode GE of the driving thin film transistor Ta may function as a first electrode CE1 of the capacitor Cst. As such, the capacitor Cst and the driving thin film transistor Ta may be formed to overlap each other. In another embodiment, the capacitor Cst may not overlap the driving thin film transistor Ta. Alternatively, the capacitor Cst may overlap the switching thin film transistor Tb.

The second electrode CE2 may include at least one of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu), and may include a single layer or multiple layers of the above material(s).

At least one first hole DH1 passing through the first inorganic insulating layer IIL1 may be defined in the first inorganic insulating layer IIL1. The first hole DH1 may pass through the first gate insulating layer 112 and the second gate insulating layer 113 included in the first inorganic insulating layer IIL1. The first hole DH1 may be located in a peripheral portion of the thin film transistor, for example, around the driving thin film transistor Ta and the switching thin film transistor Tb. The first hole DH1 may correspond to an overlap of a first sub-hole 112a of the first gate insulating layer 112 and a second sub-hole 113a of the second gate insulating layer 113. Accordingly, the first inorganic insulating layer IIL1 including the first gate insulating layer 112 and the second gate insulating layer 113 may be understood as having the first hole DH1 in a peripheral portion of the thin film transistor.

The first interlayer insulating layer 117 (e.g., the first organic insulating layer OIL1) may be arranged over the second gate insulating layer 113. In an embodiment, the first interlayer insulating layer 117 may be arranged to cover the second electrode CE2 of the capacitor Cst. In another embodiment, as illustrated in FIG. 4, the first interlayer insulating layer 117 may be arranged to cover the second electrode CE2 of the capacitor Cst, and then, by removing a portion thereof in a subsequent process, an upper portion of the second electrode CE2 may be exposed and the first interlayer insulating layer 117 may be arranged to contact a portion of the side surface of the second electrode CE2.

The first interlayer insulating layer 117 may be arranged to cover the first inorganic insulating layer IIL1 and may fill the first hole DH1 formed in the first inorganic insulating layer IIL1. Accordingly, the first hole DH1 may be filled with an organic material.

The first interlayer insulating layer 117 (e.g., the first organic insulating layer OIL1) may include an organic insulating material, such as at least one of a general-purpose polymer, such as polymethylmethacrylate (PMMA) or polystyrene (PS), a polymer derivative having a phenolic group, an acrylic polymer, an imide-based polymer, an aryl ether-based polymer, an amide-based polymer, a fluorine-based polymer, a p-xylene-based polymer, and a vinyl alcohol-based polymer, or any blend thereof. For example, the first organic insulating layer OIL1 may include at least one of acryl, methacrylic, polyester, polyethylene, polypropylene, polyethylene terephthalate, polyethylene naphthalate, polycarbonate, polyimide, polyethylene sulfonate, polyoxymethylene, polyarylate, and hexamethyldisiloxane.

The second interlayer insulating layer 118 (e.g., the second inorganic insulating layer IIL2) may be arranged over the first organic insulating layer OIL1. The second inorganic insulating layer IIL2 may be arranged to cover the first organic insulating layer OIL1 and the second electrode CE2 of the capacitor Cst.

The second inorganic insulating layer IIL2 may include an inorganic insulating material such as at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide (ZnO).

At least one second hole DH2 passing through the second inorganic insulating layer IIL2 may be defined in the second inorganic insulating layer IIL2. The second hole DH2 may overlap the first hole DH1 formed in the first inorganic insulating layer IIL1. The second hole DH2 may be located, for example, around the driving thin film transistor Ta and the switching thin film transistor Tb.

The third interlayer insulating layer 119 (e.g., the second organic insulating layer OIL2) may be arranged to cover the second inorganic insulating layer IIL2 and may fill the second hole DH2 of the second inorganic insulating layer IIL2. Accordingly, the second hole DH2 may be filled with an organic material.

The second organic insulating layer OIL2 may include an organic insulating material such as at least one of a general-purpose polymer such as polymethylmethacrylate (PMMA) or polystyrene (PS), a polymer derivative having a phenolic group, an acrylic polymer, an imide-based polymer, an aryl ether-based polymer, an amide-based polymer, a fluorine-based polymers, a p-xylene-based polymer, and a vinyl alcohol-based polymer, or any blend thereof. For example, the second organic insulating layer OIL2 may include at least one of acryl, methacrylic, polyester, polyethylene, polypropylene, polyethylene terephthalate, polyethylene naphthalate, polycarbonate, polyimide, polyethylene sulfonate, polyoxymethylene, polyarylate, and hexamethyldisiloxane.

In an embodiment, the first organic insulating layer OIL1 and the second organic insulating layer OIL2 may include the same material. FIG. 4 illustrates that the first organic insulating layer OIL1 and the second organic insulating layer OIL2 include the same material; however, embodiments are not limited thereto. For instance, the first organic insulating layer OIL1 and the second organic insulating layer OIL2 may include different materials.

Referring to FIG. 4, the display apparatus may include a first inorganic insulating layer IIL1 including a first hole DH1 and a second inorganic insulating layer IIL2 including a second hole DH2 overlapping the first hole DH1. Also, the first organic insulating layer OIL1 over the first inorganic insulating layer IIL1 may fill the first hole DH1, and the second organic insulating layer OIL2 over the second inorganic insulating layer IIL2 may fill the second hole DH2. The first hole DH1 and the second hole DH2 overlapping the first hole DH1 may be formed in a peripheral portion of the thin film transistor. Accordingly, the display apparatus may include, in a peripheral portion of the thin film transistor, at least one hole DH as a type of dummy hole passing through the first inorganic insulating layer IIL1 and the second inorganic insulating layer IIL2 and filled with an organic material. In this case, the hole DH may be distinguished from a contact hole formed in insulating layers for electrical connection between circuit elements constituting the pixel circuit PC and elements of the display element. For example, the hole DH may be distinguished from a contact hole formed in insulating layers for electrical connection between a source/drain area of a semiconductor layer constituting the thin film transistor and a contact hole (or via hole) formed in insulating layers for electrical connection between one electrode of the thin film transistor and one electrode of the display element.

A width DHW of the hole DH may be several μm. For example, the width of the hole DH may have a value between about 1 μm and about 5 μm. In an embodiment, five or more holes DH may be formed for each pixel PX.

Because the hardness of the inorganic insulating layer is higher than the hardness of the organic insulating layer, the probability of occurrence of a crack due to an external impact may be high, and when a crack occurs in the inorganic insulating layer, a crack may also occur in various signal lines arranged under and/or over the inorganic insulating layer, and thus, a defect such as disconnection may occur. According to some embodiments, the display apparatus may include a gate insulating layer, which is an inorganic insulating layer between the substrate and the thin film transistor, and an interlayer insulating layer between the thin film transistor and the display element, the interlayer insulating layer may be formed as a multiple-layer structure of organic insulating layer/inorganic insulating layer/organic insulating layer, and a hole DH filled with an organic material may be formed in the inorganic insulating layer of the gate insulating layer and the interlayer insulating layer. Accordingly, in the display apparatus according to some embodiments, even when the external impact is great, the probability of propagation of a crack may decrease and an organic material layer with low hardness may absorb a stress caused by the external impact to prevent the stress from being concentrated on the inorganic insulating layer, the peripheral signal line, and/or the like. Thus, the display apparatus according to some embodiments may minimize the influence of the external impact.

A first electrode layer 131 and a second electrode layer 132 respectively connected to the source area SA and the drain area DA of the semiconductor layer ACT may be arranged over the second organic insulating layer OIL2. The first electrode layer 131 and the second electrode layer 132 may respectively function as a source electrode and a drain electrode as connection electrodes connecting the semiconductor layer ACT to another conductive layer. The first electrode layer 131 and the second electrode layer 132 may include a high-conductivity material. The first electrode layer 131 and the second electrode layer 132 may include a conductive material including at least one of molybdenum (Mo), aluminum (Al), copper (Cu), titanium (Ti), and the like, and may include a single layer or multiple layers including the above material(s). In an embodiment, the first electrode layer 131 and the second electrode layer 132 may include a multilayer structure of Ti/Al/Ti. FIG. 4 illustrates the first electrode layer 131 and the second electrode layer 132 respectively connected to the source area SA and the drain area DA of the switching thin film transistor Tb; however, electrode layers corresponding to the first electrode layer 131 and the second electrode layer 132 may be arranged in the source area SA and the drain area DA of the driving thin film transistor Ta, respectively. A planarization layer 120 may be arranged to cover the first electrode layer 131 and the second electrode layer 132. The planarization layer 120 may include an organic material. For example, the planarization layer 120 may include an organic insulating material, such as at least one of a general-purpose polymer such as polymethylmethacrylate (PMMA) or polystyrene (PS), a polymer derivative having a phenolic group, an acryl-based polymer, an imide-based polymer, an aryl ether-based polymer, an amide-based polymer, a fluorine-based polymers, a p-xylene-based polymer, and a vinyl alcohol-based polymer, or any blend thereof.

The display element layer DEL may be arranged over the pixel circuit layer PCL. The display element layer DEL may include a display element. As the display element, the organic light emitting diode OLED may include a pixel electrode 211, an intermediate layer 212, and an opposite electrode 213.

The pixel electrode 211 of the organic light emitting diode OLED may be electrically connected to the second electrode layer 132 electrically connected to the drain area DA of the switching thin film transistor Tb through a contact hole of the planarization layer 120. Thus, the organic light emitting diode OLED may be electrically connected to the pixel circuit PC.

The pixel electrode 211 may include a conductive oxide, such as at least one of indium tin oxide (ITO), indium zinc oxide (IZO), zinc oxide (ZnO), indium oxide ($In_2O_3$), indium gallium oxide (IGO), and aluminum zinc oxide (AZO).

In other embodiments, the pixel electrode 211 may include a reflective layer including at least one of silver (Ag), magnesium (Mg), aluminum (Al), platinum (Pt), palladium (Pd), gold (Au), nickel (Ni), neodymium (Nd), iridium (Ir), and chromium (Cr), or any compound thereof. In other embodiments, the pixel electrode 211 may further include a layer formed of ITO, IZO, ZnO, or $In_2O_3$ over/under the reflective layer.

A pixel definition layer PDL including an opening PDLOP exposing a portion of the pixel electrode 211 and covering an edge of the pixel electrode 211 may be arranged over the planarization layer 120. The pixel definition layer PDL may include an organic insulating material and/or an inorganic insulating material. The opening PDLOP may define an emission area of light emitted from the organic light emitting diode OLED. For example, the width of the opening PDLOP may correspond to the width of the emission area. The pixel definition layer PDL may include, for example, an organic material, such as polyimide or hexamethyldisiloxane (HMDSO).

The intermediate layer 212 may be arranged over the pixel electrode 211. The intermediate layer 212 may include an emission layer 212b arranged in the opening PDLOP of the pixel definition layer PDL. The emission layer 212b may include a high-molecular or low-molecular weight organic material for emitting light of a certain color.

A first functional layer 212a and a second functional layer 212c may be respectively arranged under and over the emission layer 212b. The first functional layer 212a may include, for example, a hole transport layer (HTL) or may include a HTL and a hole injection layer (HIL). The second functional layer 212c may be an element arranged over the emission layer 212b and may be optional. The second functional layer 212c may include an electron transport layer (ETL) and/or an electron injection layer (EIL). The first functional layer 212a and/or the second functional layer 212c may be arranged over the pixel definition layer PDL and the pixel electrode 211. Like the opposite electrode 213 described below, the first functional layer 212a and/or the second functional layer 212c may be a common layer formed to entirely cover the substrate 100.

The opposite electrode 213 may include a conductive material having a low work function. For example, the opposite electrode 213 may include a (semi)transparent layer including at least one of silver (Ag), magnesium (Mg), aluminum (Al), platinum (Pt), palladium (Pd), gold (Au), nickel (Ni), neodymium (Nd), iridium (Ir), chromium (Cr), lithium (Li), and calcium (Ca), or any alloy thereof. Alternatively, the opposite electrode 213 may further include a layer, such as ITO, IZO, ZnO, or $In_2O_3$ over the (semi) transparent layer including the above material(s).

In an embodiment, a capping layer may be further arranged over the opposite electrode 213. The capping layer may include LiF, an inorganic material, and/or an organic material.

An encapsulation layer may be arranged over the opposite electrode 213. In an embodiment, the encapsulation layer may include at least one inorganic encapsulation layer and at least one organic encapsulation layer. In an embodiment, the encapsulation layer may include a stack structure of a first inorganic encapsulation layer/an organic encapsulation layer/a second inorganic encapsulation layer. The inorganic encapsulation layer may include one or more inorganic materials among aluminum oxide ($Al_2O_3$), titanium oxide ($TiO_2$), tantalum oxide ($Ta_2O_5$), hafnium oxide ($HfO_2$), zinc oxide (ZnO), silicon oxide ($SiO_2$), silicon nitride ($SiN_x$), and silicon oxynitride (SiON). The organic encapsulation layer may include, for example, a polymer-based material. The polymer-based material may include acryl-based resin, epoxy-based resin, polyimide, polyethylene, and/or the like.

Figure 5:
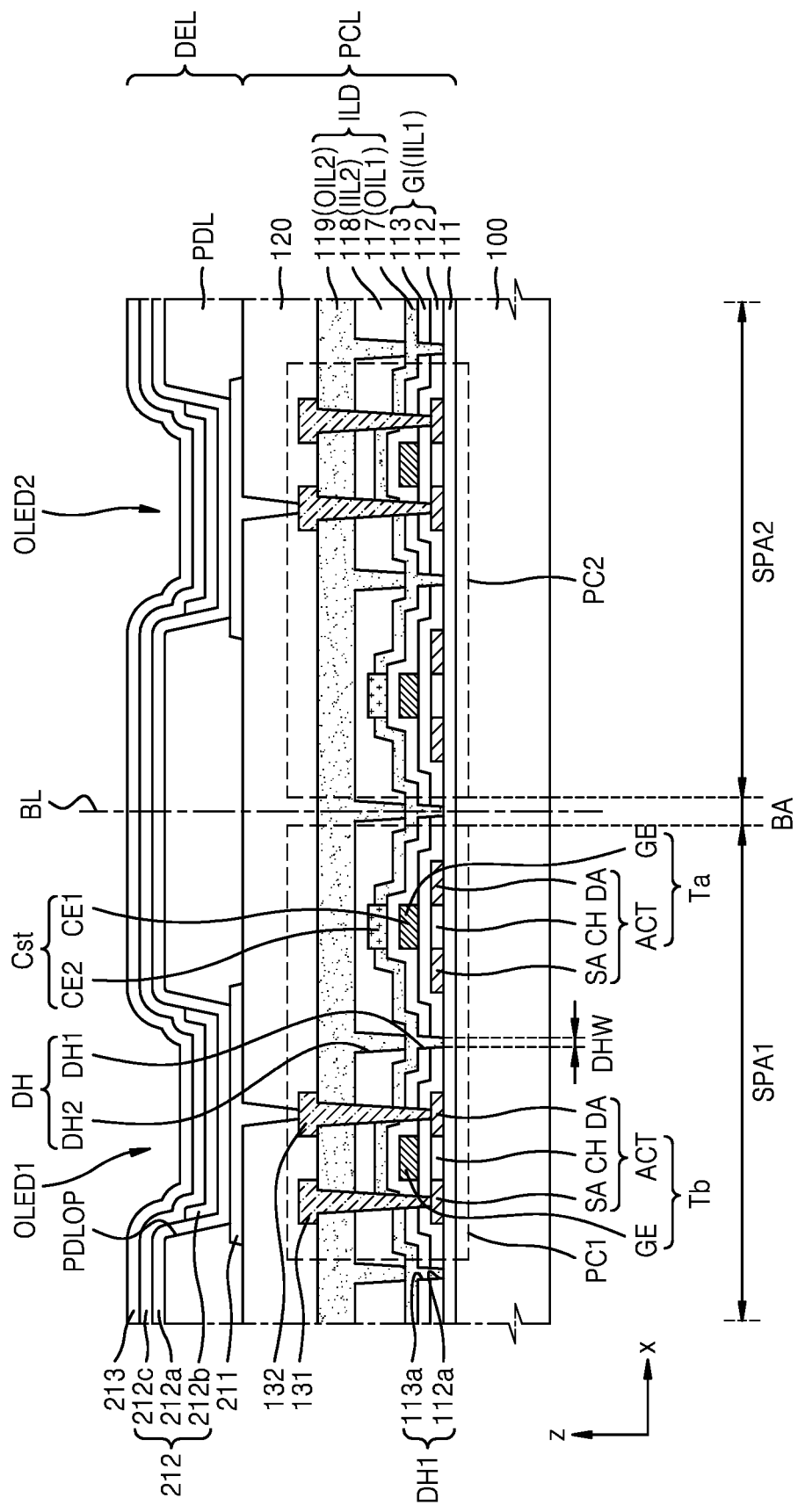
FIG. 5 is a cross-sectional view illustrating a portion of a display apparatus according to an embodiment.

FIG. 5 is a cross-sectional view illustrating a portion (e.g., two adjacent pixels) of a display apparatus according to an embodiment. In FIG. 5, like reference numerals as those in FIG. 4 denote like elements, and thus, redundant descriptions will be omitted for conciseness.

Referring to FIG. 5, the display apparatus according to an embodiment may include a substrate 100, a pixel circuit layer PCL, and a display element layer DEL. The pixel circuit layer PCL may define a pixel circuit PC. The display element layer DEL may include an organic light emitting diode OLED as a display element.

A first pixel PX1 may include a first organic light emitting diode OLED1 and a first pixel circuit PC1 connected thereto. A second pixel PX2 may include a second organic light emitting diode OLED2 and a second pixel circuit PC2 connected thereto. An area in which the pixel PX is arranged, particularly, an area in which the pixel circuit PC is arranged will be referred to as a pixel area.

Hereinafter, a pixel arranged in a first pixel area SPA1 on the left side thereof will be referred to as a first pixel PX1, and a pixel arranged in a second pixel area SPA2 on the right side thereof will be referred to as a second pixel PX2.

A gate insulating layer GI may be arranged over a buffer layer 111, and an interlayer insulating layer ILD may be arranged over the gate insulating layer GI. The gate insulating layer GI may be a first inorganic insulating layer IIL1 including a first gate insulating layer 112 and a second gate insulating layer 113. The interlayer insulating layer ILD may have a multilayer structure of a first organic insulating layer OIL1/a second inorganic insulating layer IIL2/a second organic insulating layer OIL2.

At least one hole DH passing through the first inorganic insulating layer IIL1 and the second inorganic insulating layer IIL2 may be formed in a boundary area BA around a virtual boundary line BL that divides the first pixel area SPA1 in which the first pixel PX1 is arranged and the second pixel area SPA2 in which the second pixel PX2 is arranged. As illustrated in FIG. 5, at least one hole DH passing through the first inorganic insulating layer IIL1 and the second inorganic insulating layer IIL2 may be formed in a peripheral portion of a thin film transistor arranged in each of the first pixel area SPA1 and the second pixel area SPA2. The hole DH may be filled with an organic material. The boundary area BA may be an area between the first pixel area SPA1 and the second pixel area SPA2.

Referring to FIG. 5, the display apparatus may include a first hole DH1 formed in the first inorganic insulating layer IIL1 and a second hole DH2 formed in the second inorganic insulating layer IIL2 and overlapping the first hole DH1. Also, the first organic insulating layer OIL1 over the first inorganic insulating layer IIL1 may fill the first hole DH1, and the second organic insulating layer OIL2 over the second inorganic insulating layer IIL2 may fill the second hole DH2.

The first hole DH1 and the second hole DH2 overlapping the first hole DH1 may be formed in a boundary area BA between the first pixel area SPA1 and the second pixel area SPA2 adjacent to each other. Accordingly, the display apparatus may include, between the first pixel area SPA1 and the second pixel area SPA2, at least one hole DH passing through the first inorganic insulating layer IIL1 and the second inorganic insulating layer IIL2 and filled with an organic material. In this case, the hole DH may be distinguished from a contact hole formed in insulating layers for electrical connection between circuit elements constituting the pixel circuit PC and elements of the display element.

Figure 6:
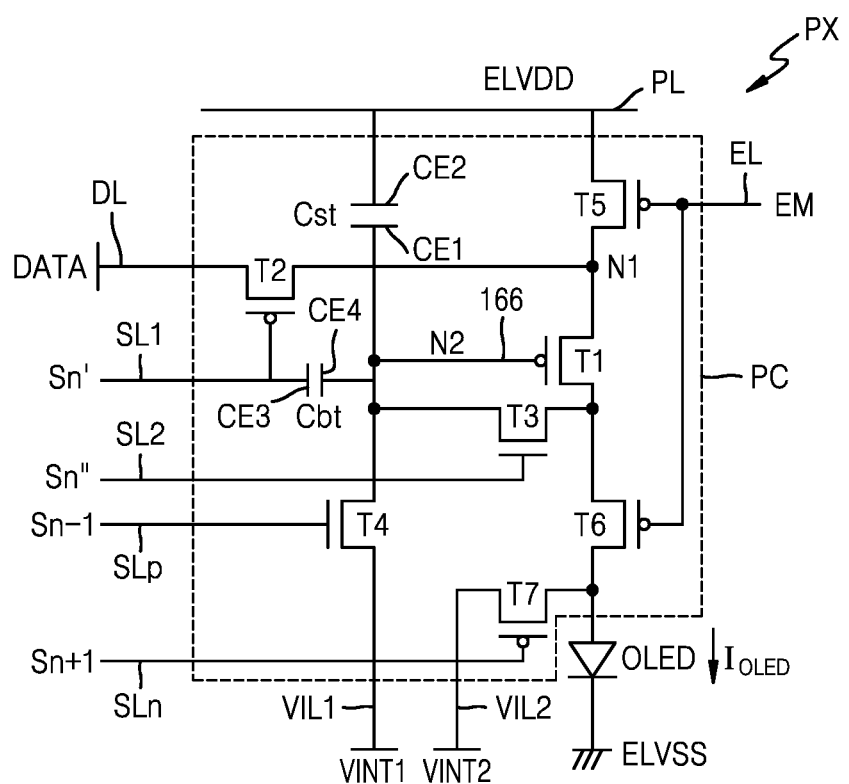
FIG. 6 is an equivalent circuit diagram schematically illustrating a pixel included in a display apparatus according to an embodiment.

FIG. 6 is an equivalent circuit diagram schematically illustrating a pixel included in a display apparatus according to an embodiment.

Referring to FIG. 6, a pixel circuit PC of a pixel PX may include a plurality of first to seventh thin film transistors T1, T2, T3, T4, T5, T6, and T7, a first capacitor Cst, a second capacitor Cbt, and an organic light emitting diode OLED as a display element. Some of the plurality of thin film transistors T1, T2, T3, T4, T5, T6, and T7 may be provided as an n-channel MOSFET (NMOS), and the others may be provided as a p-channel MOSFET (PMOS).

In an embodiment, among the plurality of thin film transistors T1, T2, T3, T4, T5, T6, and T7, the third thin film transistor T3 and the fourth initialization thin film transistor T4 may be provided as an NMOS and the others may be provided as a PMOS.

In another embodiment, among the plurality of thin film transistors T1, T2, T3, T4, T5, T6, and T7, the third thin film transistor T3, the fourth thin film transistor T4, and the seventh thin film transistor T7 may be provided as an NMOS and the others may be provided as a PMOS. Alternatively, only one of the plurality of thin film transistors T1, T2, T3, T4, T5, T6, and T7 may be provided as an NMOS and the others may be provided as a PMOS. Alternatively, all of the plurality of thin film transistors T1, T2, T3, T4, T5, T6, and T7 may be provided as an NMOS.

FIG. 6 illustrates that the third thin film transistor T3 and the fourth thin film transistor T4 among the first to seventh thin film transistors T1 to T7 are implemented as a NMOS and the others are implemented as a PMOS.

The pixel circuit PC may include a first scan line SL1 configured to transmit a first scan signal Sn', a second scan line SL2 configured to transmit a second scan signal Sn", a previous scan line SLp configured to transmit a previous scan signal Sn−1 to the fourth thin film transistor T4, an emission control line EL configured to transmit an emission control signal EM to the fifth film transistor T5 and the sixth thin film transistor T6, a next scan line SLn configured to transmit a next scan signal Sn+1 to the seventh thin film transistor T7, and a data line DL configured to transmit a data signal DATA.

A power voltage line PL may be configured to transmit a first power voltage ELVDD to the first thin film transistor T1. A first initialization voltage line VIL1 may be configured to transmit a first initialization voltage VINT1 for initializing the first thin film transistor T1 to the pixel PX. A second initialization voltage line VIL2 may be configured to transmit a second initialization voltage VINT2 for initializing the organic light emitting diode OLED to the pixel PX.

The first scan line SL1, the second scan line SL2, the previous scan line SLp, the next scan line SLn, the emission control line EL, and the first and second initialization voltage lines VIL1 and VIL2 may extend in the first direction x and may be arranged apart from each other in each row. The data line DL and the power voltage line PL may extend in the second direction y and may be arranged apart from each other in each column.

The first thin film transistor T1 may be connected to the power voltage line PL via the fifth thin film transistor T5 and may be electrically connected to the organic light emitting diode OLED via the sixth thin film transistor T6. The first thin film transistor T1 may function as a driving transistor and may receive the data signal DATA according to a switching operation of the second thin film transistor T2 to supply a driving current $I_{OLED}$ to the organic light emitting diode OLED.

The second thin film transistor T2 may be connected to the first scan line SL1 and the data line DL and may be connected to the power voltage line PL via the fifth thin film transistor T5. The second thin film transistor T2 may perform a switching operation of transmitting the data signal DATA received through the data line DL to a node N1 by being turned on according to the first scan signal Sn' received through the first scan line SL1.

The third thin film transistor T3 may be connected to the second scan line SL2 and may be connected to the organic light emitting diode OLED via the sixth thin film transistor T6. The third thin film transistor T3 may be turned on according to the second scan signal Sn" received through the second scan line SL2 to diode-connect the first thin film transistor T1 to compensate for the threshold voltage of the first thin film transistor T1.

The fourth thin film transistor T4 may be connected to the previous scan line SLp and the first initialization voltage line VIL1 and may be turned on according to the previous scan signal Sn−1 received through the previous scan line SLp to transmit the first initialization voltage VINT1 from the first initialization voltage line VIL1 to the gate electrode of the first thin film transistor T1 to initialize the gate voltage of the first thin film transistor T1.

The fifth thin film transistor T5 and the sixth thin film transistor T6 may be connected to the emission control line EL and may be simultaneously turned on according to the emission control signal EM received through the emission control line EL to form a current path to allow a driving current $I_{OLED}$ to flow from the power voltage line PL to the organic light emitting diode OLED.

The seventh thin film transistor T7 may be connected to the next scan line SLn and the second initialization voltage line VIL2 and may be turned on according to the next scan signal Sn+1 received through the next scan line SLn to transmit the second initialization voltage VINT2 from the second initialization voltage line VIL2 to the organic light emitting diode OLED to initialize the organic light emitting diode OLED. The seventh thin film transistor T7 may be omitted.

The first capacitor Cst may include a first electrode CE1 and a second electrode CE2. The first electrode CE1 may be connected to the gate electrode of the first thin film transistor T1, and the second electrode CE2 may be connected to the power voltage line PL. The first capacitor Cst may be configured to store and maintain a voltage corresponding to the voltage difference between both ends of the gate electrode of the first thin film transistor T1 to maintain a voltage applied to the gate electrode of the first thin film transistor T1.

The second capacitor Cbt may include a third electrode CE3 and a fourth electrode CE4. The third electrode CE3 may be connected to the first scan line SL1 and the gate electrode of the second thin film transistor T2. The fourth electrode CE4 may be connected to the gate electrode of the first thin film transistor T1 and the first electrode CE1 of the first capacitor Cst. As a boosting capacitor, the second capacitor Cbt may increase a voltage of a node N2 to clearly represent black gradation when the first scan signal Sn of the first scan line SL1 is a voltage for turning off the second thin film transistor T2.

The organic light emitting diode OLED may include a pixel electrode and an opposite electrode, and the opposite electrode may receive a second power voltage ELVSS. The organic light emitting diode OLED may receive the driving current $I_{OLED}$ from the first thin film transistor T1 to emit light to display an image.

A particular operation of each pixel PX according to an embodiment may be as follows.

In a first initialization period, when the previous scan signal Sn−1 is supplied through the previous scan line SLp, the fourth thin film transistor T4 may be turned on in response to the previous scan signal Sn−1 and the first thin film transistor T1 may be initialized by the first initialization voltage VINT1 supplied from the first initialization voltage line VIL1.

In a data programming period, when the first scan signal Sn' and the second scan signal Sn" are respectively supplied through the first scan line SL1 and the second scan line SL2, the second thin film transistor T2 and the third thin film transistor T3 may be turned on in response to the first scan signal Sn' and the second scan signal Sn". In this case, the first thin film transistor T1 may be diode-connected and forward-biased by the turned-on third thin film transistor T3. Then, a voltage compensated for a threshold voltage Vth of the first thin film transistor T1 from the data signal DATA supplied from the data line DL may be applied to the gate electrode of the first thin film transistor T1. The first power voltage ELVDD and a compensation voltage may be applied to both ends of the first capacitor Cst, and the charge corresponding to the voltage difference between both ends thereof may be stored in the first capacitor Cst.

In an emission period, the fifth thin film transistor T5 and the sixth thin film transistor T6 may be turned on by the emission control signal EM supplied from the emission control line EL. A driving current $I_{OLED}$ may be generated according to the voltage difference between the first power voltage ELVDD and the voltage of the gate electrode of the first thin film transistor T1, and the driving current $I_{OLED}$ may be supplied to the organic light emitting diode OLED through the sixth thin film transistor T6.

In a second initialization period, when the next scan signal Sn+1 is supplied through the next scan line SLn, the seventh thin film transistor T7 may be turned on in response to the next scan signal Sn+1 and the organic light emitting diode OLED may be initialized by the second initialization voltage VINT2 supplied from the second initialization voltage line VIL2.

In some embodiments, at least one of the plurality of thin film transistors T1 to T7 may include a semiconductor layer including oxide and the others may include a semiconductor layer including silicon.

For example, the first thin film transistor T1 directly affecting the brightness of the display apparatus may be configured to include a semiconductor layer including polycrystalline silicon having high reliability, and accordingly, a high-resolution display apparatus may be implemented.

Moreover, at least because an oxide semiconductor may have a high carrier mobility and a low leakage current, a voltage drop thereof may not be great even when a driving time thereof is long. For instance, low-frequency driving may be possible because a color change of an image due to a voltage drop may not be great even in the case of low-frequency driving.

As such, because an oxide semiconductor may have a small leakage current, at least one of the third thin film transistor T3 and the fourth thin film transistor T4 connected to the gate electrode of the first thin film transistor T1 may include an oxide semiconductor to reduce power consumption while preventing a leakage current that may flow to the gate electrode of the first thin film transistor T1.

Figure 7:
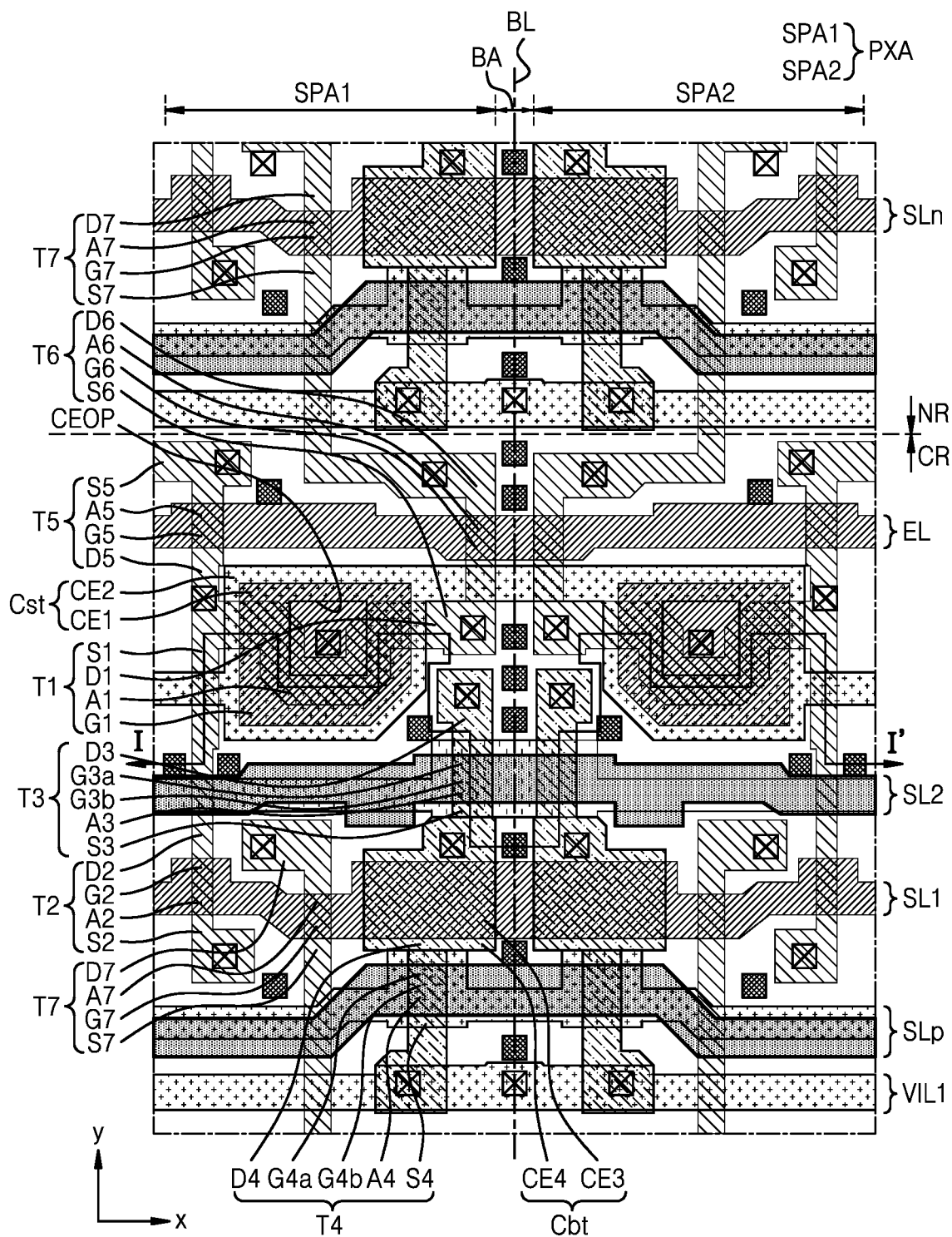
FIG. 7 is a layout diagram schematically illustrating positions of a capacitor and a plurality of thin film transistors in each of two adjacent pixels according to an embodiment.
Figure 8:
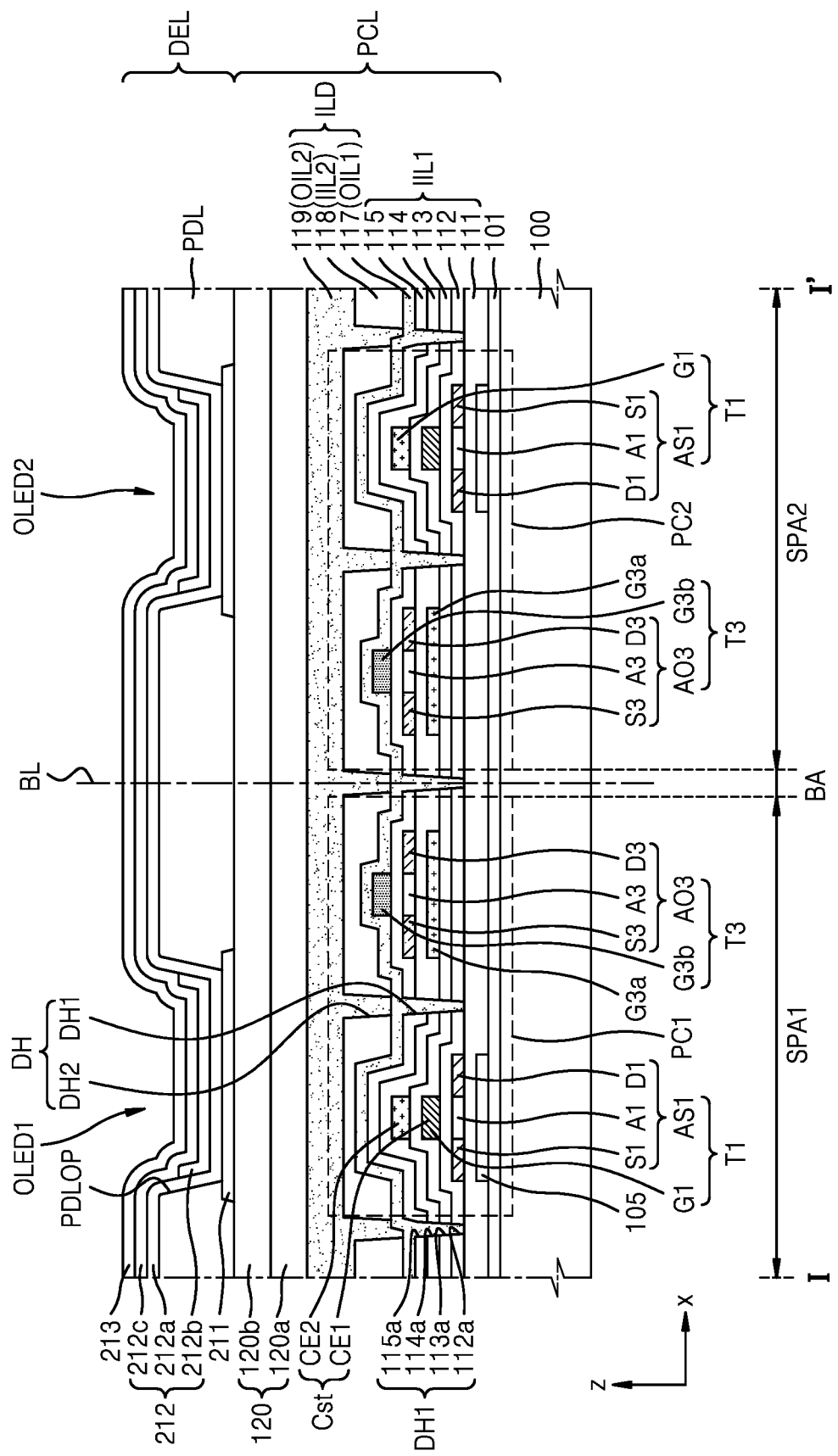
FIG. 8 is a cross-sectional view of the pixel of FIG. 7 taken along sectional line I-I' according to an embodiment.

FIG. 7 is a layout diagram schematically illustrating positions of a capacitor and a plurality of thin film transistors in each of two adjacent pixels according to an embodiment. FIG. 8 is a cross-sectional view of the pixel of FIG. 7 taken along sectional line I-I' of FIG. 7 according to an embodiment.

A pixel area PXA may be an area in which a pair of pixels PX are arranged and may include a first pixel area SPA1 on the left side and a second pixel area SPA2 on the right side. Hereinafter, a pixel arranged in the first pixel area SPA1 will be referred to as a first pixel PX1, and a pixel arranged in the second pixel area SPA2 will be referred to as a second pixel PX2. A pixel circuit of the first pixel PX1 arranged in the first pixel area SPA1 and a pixel circuit of the second pixel PX2 arranged in the second pixel area SPA2 may be symmetrical with respect to a virtual boundary line BL that divides the first pixel area SPA1 and the second pixel area SPA2. The boundary area BA may be an area between the first pixel area SPA1 and the second pixel area SPA2.

The pixel circuit of the pixel arranged in the first pixel area SPA1 and the pixel circuit of the pixel arranged in the second pixel area SPA2 illustrated in FIG. 7 may be bilaterally symmetrical to each other.

Referring to FIG. 7, a pixel circuit of a display apparatus according to an embodiment may be connected to a first scan line SL1, a second scan line SL2, a previous scan line SLp, a next scan line SLn, an emission control line EL, and first and second initialization voltage lines VIL1 and VIL2 that extend in the first direction x. Although not illustrated in FIG. 7 for convenience of description, the pixel circuit may be connected to a data line and a power voltage line that extend in the second direction y intersecting with the first direction x.

The pixel circuit may include a first thin film transistor T1, a second thin film transistor T2, a third thin film transistor T3, a fourth thin film transistor T4, a fifth thin film transistor T5, a sixth thin film transistor T6, a seventh thin film transistor T7, a first capacitor Cst, and a second capacitor Cbt.

In an embodiment, the first thin film transistor T1, the second thin film transistor T2, the fifth thin film transistor T5, the sixth thin film transistor T6, and the seventh thin film transistor T7 may be provided as a thin film transistor including a silicon semiconductor. The third thin film transistor T3 and the fourth thin film transistor T4 may be provided as thin film transistors including an oxide semiconductor.

Moreover, the next scan line SLn may be a first scan line SL1 of a next row NR. For example, the first scan line SL1 illustrated in FIG. 7 may be a next scan line SLn of a previous row. In FIG. 7, a seventh transistor T7 connected to a pixel of a next row and arranged in a pixel area of a current row CR and a seventh transistor T7 connected to a pixel of a current row and arranged in a pixel area of a previous row are illustrated together. Hereinafter, a description will be given with reference to the seventh transistor T7 arranged in a pixel area of the next row NR.

The semiconductor layers of the first thin film transistor T1, the second thin film transistor T2, the fifth thin film transistor T5, the sixth thin film transistor T6, and the seventh thin film transistor T7 may be arranged on the same layer and may include the same material. For example, the semiconductor layer may include polycrystalline silicon. The semiconductor layers of the first thin film transistor Ti, the second thin film transistor T2, the fifth thin film transistor T5, the sixth thin film transistor T6, and the seventh thin film transistor T7 may be connected to each other and may be curved in various shapes.

Each of the semiconductor layers of the first thin film transistor Ti, the second thin film transistor T2, the fifth thin film transistor T5, the sixth thin film transistor T6, and the seventh thin film transistor T7 may include a channel area and a source area and a drain area on both sides of the channel area. For example, the source area and the drain area may be doped with dopants, and the dopants may include N-type dopants or P-type dopants. The source area and the drain area may respectively correspond to the source electrode and the drain electrode. The source area and the drain area may be interchanged with each other depending on the property of the transistor. Hereinafter, the terms "source area" and "drain area" will be used instead of the source electrode and the drain electrode.

The first thin film transistor T1 may include a first semiconductor layer AS1 and a first gate electrode G1. The first semiconductor layer AS1 may include a first channel area A1 and a first source area S1 and a first drain area D1 on both sides of the first channel area A1. The first semiconductor layer AS1 may have a curved shape, and thus, the first channel area A1 may be longer than other channel areas A2 to A7. For example, a long channel length may be formed in a narrow space when the first semiconductor layer AS1 has a shape that is bent multiple times, such as a 'c,' 'inverted S,' 'S,' 'M,' or 'W' shape. Because the first channel area A1 is formed long, the driving range of a gate voltage applied to the first gate electrode G1 may widen, and thus, the gradation of light emitted from an organic light emitting diode OLED may be more finely controlled and the display quality thereof may be improved. In some embodiments, the first semiconductor layer AS1 may be provided in a straight shape rather than a bent shape. The first gate electrode G1 may have an island type and may be provided to overlap the first channel area A1 with the first gate insulating layer 112 (see FIG. 8) therebetween.

The first capacitor Cst may be arranged to overlap the first thin film transistor T1. The first capacitor Cst may include a first electrode CE1 and a second electrode CE2. For instance, the first gate electrode G1 may function not only as a control electrode of the first thin film transistor T1, but also as the first electrode CE1 of the first capacitor Cst. As such, the first gate electrode G1 may be integrally formed with the first electrode CE1. The second electrode CE2 of the first capacitor Cst may be provided to overlap the first electrode CE1 with the second gate insulating layer 113 (see FIG. 8) therebetween. In this case, the second gate insulating layer 113 may function as a dielectric layer of the first capacitor Cst.

The second electrode CE2 may include an opening portion CEOP. The opening portion CEOP may be formed by removing a portion of the second electrode CE2 and may have a closed shape. A node connection line (not illustrated) may be connected to the first electrode CE1 through a contact hole arranged in the opening portion CEOP. The second electrode CE2 may extend in the first direction x to transmit a first power voltage ELVDD in the first direction x. Accordingly, a plurality of first power voltage lines and a plurality of second electrodes CE2 may form a mesh structure in a display area DA.

The second thin film transistor T2 may include a second semiconductor layer and a second gate electrode G2. The second semiconductor layer may include a second channel area A2 and a second source area S2 and a second drain area D2 on both sides of the second channel area A2. The second source area S2 may be electrically connected to the data line, and the second drain area D2 may be connected to the first source area S1. The second gate electrode G2 may be provided as a portion of the first scan line SL1.

The fifth thin film transistor T5 may include a fifth semiconductor layer and a fifth gate electrode G5. The fifth semiconductor layer may include a fifth channel area A5 and a fifth source area S5 and a fifth drain area D5 on both sides of the fifth channel area A5. The fifth source area S5 may be electrically connected to the power voltage line configured to supply the first power voltage ELVDD, and the fifth drain area D5 may be connected to the first source area S1. The fifth gate electrode G5 may be provided as a portion of the emission control line EL.

The sixth thin film transistor T6 may include a sixth semiconductor layer and a sixth gate electrode G6. The sixth semiconductor layer may include a sixth channel area A6 and a sixth source area S6 and a sixth drain area D6 on both sides of the sixth channel area A6. The sixth source area S6 may be connected to the first drain area D1, and the sixth drain area D6 may be electrically connected to the pixel electrode 211 (see FIG. 8) of the organic light emitting diode OLED. The sixth gate electrode G6 may be provided as a portion of the emission control line EL.

The seventh thin film transistor T7 may include a seventh semiconductor layer and a seventh gate electrode G7. The seventh semiconductor layer may include a seventh channel area A7 and a seventh source area S7 and a seventh drain area D7 on both sides of the seventh channel area A7. The seventh source area S7 may be electrically connected to a second initialization voltage line (not illustrated), and the seventh drain area D7 may be connected to the sixth drain area D6. The seventh gate electrode G7 may be provided as a portion of the next scan line SLn.

The interlayer insulating layer 114 (see FIG. 8) may be arranged over the first, second, and fifth to seventh thin film transistors T1, T2, T5, T6, and T7 including a silicon semiconductor, and the third and fourth thin film transistors T3 and T4 including an oxide semiconductor may be arranged over the interlayer insulating layer 114.

The semiconductor layers of the third thin film transistor T3 and the fourth thin film transistor T4 may be arranged on the same layer and may include the same material. For example, the semiconductor layer may include an oxide semiconductor.

The semiconductor layer may include a channel area and a source area and a drain area on both sides of the channel area. For example, the source area and the drain area may be an area in which a carrier concentration is increased by plasma treatment. The source area and the drain area may respectively correspond to the source electrode and the drain electrode. Hereinafter, the terms "source area" and "drain area" will be used instead of the source electrode and the drain electrode.

The third thin film transistor T3 may include a third gate electrode and a third semiconductor layer AO3 including an oxide semiconductor. The third semiconductor layer AO3 may include a third channel area A3 and a third source area S3 and a third drain area D3 on both sides of the third channel area A3. The third source area S3 may be bridge-connected to the first gate electrode G1 through a node connection line 166 (see FIG. 6). The third gate electrode may include a first lower gate electrode G3a and/or a first upper gate electrode G3b. Also, the third source area S3 may be connected to a fourth drain area D4 arranged on the same layer. The third drain area D3 may be electrically connected to the first semiconductor layer AS1 of the first thin film transistor T1 and the sixth semiconductor layer of the sixth thin film transistor T6. The third gate electrode G3a, G3b may be provided as a portion of the second scan line SL2.

The fourth thin film transistor T4 may include a fourth gate electrode and a fourth semiconductor layer including an oxide semiconductor. The fourth semiconductor layer may include a fourth channel area A4 and a fourth source area S4 and a fourth drain area D4 on both sides of the fourth channel area A4. The fourth source area S4 may be electrically connected to the first initialization voltage line VIL1, and the fourth drain area D4 may be bridge-connected to the first gate electrode G1 via the node connection line 166 (see FIG. 6). The fourth gate electrode is provided as a portion of the previous scan line SLp. The fourth gate electrode may include a second lower gate electrode G4a and/or a second upper gate electrode G4b.

Between the third semiconductor layer AO3 and the third gate electrode G3b and between the fourth semiconductor layer and the fourth gate electrode G4b, a third gate insulating layer 115 (see FIG. 8) may be arranged to correspond to each channel area.

A third electrode CE3 of the second capacitor Cbt may be provided as a portion of the first scan line SL1 to be connected to the second gate electrode G2. A fourth electrode CE4 of the second capacitor Cbt may be arranged to overlap the third electrode CE3 and may include an oxide semiconductor. The fourth electrode CE4 may be provided on the same layer as the third semiconductor layer AO3 of the third thin film transistor T3 and the fourth semiconductor layer of the fourth thin film transistor T4 and may be an area between the third semiconductor layer AO3 and the fourth semiconductor layer. Alternatively, the fourth electrode CE4 may be provided to extend from the fourth semiconductor layer. Alternatively, the fourth electrode CE4 may be provided to extend from the third semiconductor layer AO3.

A first organic insulating layer OIL1 (see FIG. 8) may be arranged over the third and fourth thin film transistors T3 and T4 including an oxide semiconductor, and a second inorganic insulating layer IIL2 (see FIG. 8) may be arranged over the first organic insulating layer OIL1. A power voltage line, a second initialization voltage line, and a node connection line 166 (see FIG. 6) may be arranged over the first organic insulating layer OIL1. A second organic insulating layer OIL2 (see FIG. 8) may be arranged over the second inorganic insulating layer IIL2, and a planarization layer 120 (see FIG. 8) may be arranged over the second organic insulating layer OIL2.

In an embodiment, the first scan line SL1 and the emission control line EL may be arranged on the same layer and may include the same material as the first gate electrode G1.

In an embodiment, some of the lines may be provided as two conductive layers arranged on different layers. For example, the previous scan line SLp may include a lower previous scan line and an upper previous scan line arranged on different layers. The lower previous scan line may include the same material as the second electrode CE2 of the first capacitor Cst. The upper previous scan line may be arranged over the third gate insulating layer 115 (see FIG. 8). The lower previous scan line may be arranged to at least partially overlap the upper previous scan line. The lower previous scan line and the upper previous scan line may correspond to a portion of the third gate electrode of the third thin film transistor T3, and the third thin film transistor T3 may have a double gate structure including control electrodes over and under the semiconductor layer respectively.

Also, in an embodiment, the second scan line SL2 may include a lower second scan line and an upper second scan line arranged on different layers. The lower second scan line may include the same material as the second electrode CE2 of the first capacitor Cst. The upper second scan line may be arranged over the third gate insulating layer 115 (see FIG. 8). The lower second scan line may be arranged to at least partially overlap the upper second scan line. The lower second scan line and the upper second scan line may correspond to a portion of the fourth gate electrode G4 of the fourth thin film transistor T4, and the fourth thin film transistor T4 may have a double gate structure including control electrodes arranged over and under the semiconductor layer respectively.

An initialization voltage line VIL may include a first initialization voltage line VIL1 and a second initialization voltage line VIL2 (see FIG. 7) arranged on different layers. In an embodiment, the first initialization voltage line VIL1 may be arranged on the same layer and may include the same material as the second electrode CE2 of the first capacitor Cst. Although not shown in FIG. 8, the second initialization voltage line VIL2 (see FIG. 7) may be arranged on the same layer and may include the same material as the node connection line 166 (see FIG. 6).

FIG. 7 illustrates that the display apparatus includes at least one hole DH in the boundary area BA between the first pixel area SPA1 and the second pixel area SPA2 adjacent to each other. Also, at least one hole DH may be included in a peripheral portion of the thin film transistor of each of the first pixel area SPA1 and the second pixel area SPA2. In this case, the hole DH may be located in an area where a semiconductor layer and a conductive layer constituting a pixel circuit are not arranged in each of the first pixel area SPA1 and the second pixel area SPA2. The hole DH may be formed through the first inorganic insulating layer IIL1 (see FIG. 8) and the second inorganic insulating layer IIL2 (see FIG. 8), and the hole DH may be filled with an organic material.

Hereinafter, with reference to FIGS. 7 and 8, a structure of a display apparatus according to an embodiment will be described in more detail according to the stacking order thereof. In FIG. 8, like reference numerals as those in FIGS. 4 and 5 will denote like members, and thus, redundant descriptions will be omitted for conciseness.

The display apparatus may include a substrate 100, a pixel circuit layer PCL, and a display element layer DEL. The pixel circuit layer PCL may define a pixel circuit PC. The display element layer DEL may include an organic light emitting diode OLED as a display element.

The substrate 100 may include at least one of a glass material, a ceramic material, a metal material, and a flexible or bendable material.

The substrate 100 may have a single-layer or multiple-layer structure of the above material(s) and may further include an inorganic layer in the case of having a multiple-layer structure. In the case of a multiple-layer structure, an inorganic layer may be further included. In some embodiments, the substrate 100 may have an organic/inorganic/organic structure.

The pixel circuit of the pixel arranged in the first pixel area SPA1 and the pixel circuit of the pixel arranged in the second pixel area SPA2 illustrated in FIG. 8 may be bilaterally symmetrical to each other. In FIG. 8, the structures of the first thin film transistor T1, the third thin film transistor T3, the first capacitor Cst, and the second capacitor Cbt are mainly illustrated, and some members may be omitted.

The pixel circuit layer PCL may include a plurality of inorganic insulating layers and a plurality of organic insulating layers. Referring to FIG. 8, the pixel circuit layer PCL may include a buffer layer 111, a first inorganic insulating layer IIL1, a first organic insulating layer OIL1, a second inorganic insulating layer IIL2, and a second organic insulating layer OIL2. In this case, the display apparatus may include at least one hole DH passing through the first inorganic insulating layer IIL1 and the second inorganic insulating layer IIL2. The hole DH may be formed in a boundary area BA of the first pixel area SPA1 and the second pixel area SPA2. In an embodiment, the hole DH may be formed in a peripheral portion of the thin film transistor. The hole DH may be filled with an organic material.

A buffer layer 111 may be arranged over the substrate 100. The buffer layer 111 may function to increase the smoothness of the upper surface of the substrate 110, and the buffer layer 111 may include an oxide layer, such as silicon oxide ($SiO_x$), and/or a nitride layer, such as silicon nitride ($SiN_x$) or silicon oxynitride (SiON).

A barrier layer 101 may be further included between the substrate 100 and the buffer layer 111. The barrier layer 101 may function to prevent or minimize the penetration of impurities from the substrate 100 or the like into a silicon semiconductor layer. The barrier layer 101 may include an inorganic material, such as oxide or nitride, and/or an organic material and may include a single-layer or multiple-layer structure of an inorganic material and an organic material.

A shielding layer 105 may be arranged between the barrier layer 101 and the buffer layer 111. The shielding layer 105 may correspond to a portion of the pixel circuit and may be arranged under the pixel circuit. In an embodiment, the shielding layer 105 may be arranged under the first semiconductor layer AS1 of the first thin film transistor T1 to prevent the characteristics of the first thin film transistor T1 from being degraded due to external light and/or electrical signals therearound.

The shielding layer 105 may include amorphous silicon and may include, for example, doped amorphous silicon. For example, the shielding layer 105 may include p-type amorphous silicon obtained by doping pure amorphous silicon with dopants, such as aluminum (Al), boron (B), or indium (In). As another example, the shielding layer 105 may include n-type amorphous silicon obtained by doping pure amorphous silicon with dopants, such as phosphorus (P), arsenic (As), or antimony (Sb). Because the shielding layer 105 includes doped amorphous silicon, it may have a relatively low light transmittance. The shielding layer 105 may be relatively electrically stable by including amorphous silicon even without receiving a separate constant voltage applied thereto.

The shielding layer 105 may include a metal, such as at least one of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu).

The shielding layer 105 may be provided as a single layer or multiple layers of the above material(s).

A semiconductor layer (e.g., silicon semiconductor layer) of the first thin film transistor T1, the second thin film transistor T2, the fifth thin film transistor T5, the sixth thin film transistor T6, and the seventh thin film transistor T7 may be arranged over the buffer layer 111.

The silicon semiconductor layer may include a channel area A1 and a source area S1 and a drain area D1 as a first semiconductor layer AS1 of the first thin film transistor Ti, a channel area A2 and a source area S2 and a drain area D2 as a second semiconductor layer of the second thin film transistor T2, a channel area A5 and a source area S5 and a drain area D5 as a fifth semiconductor layer of the fifth thin film transistor T5, a channel area A6 and a source area S6 and a drain area D6 as a sixth semiconductor layer of the sixth thin film transistor T6, and a channel area A7 and a source area S7 and a drain area D7 as a seventh semiconductor layer of the seventh thin film transistor T7. For instance, the channel area, the source area, and the drain area of each of the first to seventh thin film transistors T1 to T7 may be some areas of the silicon semiconductor layer.

A first gate insulating layer 112 may be located over the silicon semiconductor layer. The first gate insulating layer 112 may include an inorganic material including oxide or nitride. For example, the first gate insulating layer 112 may include an inorganic insulating material, such as at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide (ZnO).

A gate electrode G1 of the first thin film transistor T1, a gate electrode G2 of the second thin film transistor T2, a gate electrode G5 of the fifth thin film transistor T5, a gate electrode G6 of the sixth thin film transistor T6, and a gate electrode G7 of the seventh thin film transistor T7 may be arranged over the first gate insulating layer 112. Also, a first scan line SL1 and an emission control line EL may be arranged over the first gate insulating layer 112 to extend in the first direction x. A portion of the first scan line SL1 may be a third electrode CE3 of the second capacitor Cbt.

The gate electrode G1 of the first thin film transistor T1 may be provided as an island (isolated) type. The gate electrode G2 of the second thin film transistor T2 may be a portion of the first scan line SL1 intersecting with the silicon semiconductor layer. The gate electrode G7 of the seventh thin film transistor T7 may be a portion of the next scan line SLn intersecting with the silicon semiconductor layer. The gate electrode G5 of the fifth thin film transistor T5 and the gate electrode G6 of the sixth thin film transistor T6 may be portions of the emission control line EL intersecting with the silicon semiconductor layer.

The gate electrode G1 of the first thin film transistor T1 may function not only as a control electrode of the first thin film transistor T1, but also as the first electrode CE1 of the first capacitor Cst.

A second gate insulating layer 113 may be arranged over a gate electrode, such as the gate electrode G1 of the first thin film transistor T1. The second gate insulating layer 113 may include an inorganic material including oxide or nitride.

A second electrode CE2 of the first capacitor Cst may be arranged over the second gate insulating layer 113 to overlap the first electrode CE1.

The second electrodes CE2 of adjacent pixels may be connected to each other by a bridge. The bridge may be a portion protruding from the second electrode CE2 in the first direction x and may be integrally formed with the second electrode CE2.

A fourth interlayer insulating layer 114 may be arranged over the second electrode CE2 of the first capacitor Cst. The fourth interlayer insulating layer 114 may include an inorganic material including oxide or nitride. For example, the fourth interlayer insulating layer 114 may include an inorganic insulating material, such as at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide (ZnO).

An oxide semiconductor layer including an oxide semiconductor may be arranged over the fourth interlayer insulating layer 114. The oxide semiconductor layer may include a Zn oxide-based material, such as a Zn oxide, an In—Zn oxide, or a Ga—In—Zn oxide. In some embodiments, the oxide semiconductor layer may include an In—Ga—Zn—O (IGZO), In—Sn—Zn—O (ITZO), or In—Ga—Sn—Zn—O (IGTZO) semiconductor containing a metal, such as indium (In), gallium (Ga), or tin (Sn) in ZnO.

Each of the semiconductor layers of the third thin film transistor T3 and the fourth thin film transistor T4 may include a channel area and a source area and a drain area on both sides of the channel area. The source area and the drain area of the third thin film transistor T3 and the fourth thin film transistor T4 may be formed by controlling the carrier concentration of the oxide semiconductor to make it conductive. For example, the source area and the drain area of the third thin film transistor T3 and the fourth thin film transistor T4 may be formed by increasing the carrier concentration through plasma treatment using hydrogen (H)-based gas, fluorine (F)-based gas, or a combination thereof on the oxide semiconductor.

The oxide semiconductor layer may include a channel area A3 and a source area S4 and a drain area D3 as a third semiconductor layer AO3 of the third thin film transistor T3, and a channel area A4 and a source area S4 and a drain area D4 as a fourth semiconductor layer of the fourth thin film transistor T4. That is, the channel area, the source area, and the drain area of each of the third thin film transistor T3 and the fourth thin film transistor T4 may be some areas of the oxide semiconductor layer. The source area S4 of the fourth thin film transistor T4 may overlap and may be electrically connected to the first initialization voltage line VIL1.

A first lower gate electrode G3a as a portion of the lower previous scan line of the previous scan line SLp may be arranged under the third semiconductor layer AO3, and a first upper gate electrode G3b as a portion of the upper previous scan line of the previous scan line SLp may be arranged over the third semiconductor layer AO3. That is, the third thin film transistor T3 may have a double gate structure including a pair of gate electrodes arranged to overlap each other with the third semiconductor layer AO3 therebetween.

A second lower gate electrode as a portion of the lower second scan line of the second scan line SL2 may be arranged under the fourth semiconductor layer, and a second lower gate electrode as a portion of the upper second scan line of the second scan line SL2 may be arranged over the third semiconductor layer. That is, the fourth thin film transistor T4 may have a double gate structure including a pair of gate electrodes arranged to overlap each other with the fourth semiconductor layer therebetween.

A fourth interlayer insulating layer 114 may be arranged between the first lower gate electrode G3a and the third semiconductor layer AO3 and between the second lower gate electrode and the fourth semiconductor layer. The first lower gate electrode G3a and the second lower gate electrode may be arranged on the same layer and may include the same material as the second electrode of the first capacitor Cst.

A third gate insulating layer 115 may be arranged between the third semiconductor layer AO3 and the first upper gate electrode G3b and between the fourth semiconductor layer and the second upper gate electrode G4b. The first upper gate electrode G3b may be arranged to overlap the third channel area A3 and may be insulated from the third semiconductor layer AO3 by the third gate insulating layer 115. The second upper gate electrode G4b may be arranged to overlap the fourth channel area A4 and may be insulated from the fourth semiconductor layer by the third gate insulating layer 115.

In some embodiments, the third gate insulating layer 115 may be formed through the same mask process as the first upper gate electrode G3b and the second upper gate electrode G4b, and in this case, the third gate insulating layer 115 may be formed in the same shape as the first upper gate electrode G3b and the second upper gate electrode G4b.

The third gate insulating layer 115 may include an inorganic material including oxide or nitride. For example, the third gate insulating layer 115 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide (ZnO).

The first upper gate electrode G3b and the second upper gate electrode G4b may be arranged over the third gate insulating layer 115. The first upper gate electrode G3b and the second upper gate electrode G4b may include, for example, at least one of molybdenum (Mo), copper (Cu), titanium (Ti), and the like, and may include a single layer or multiple layers.

The second capacitor Cbt may include a third electrode CE3 and a fourth electrode CE4. The third electrode CE3 may be arranged over the first gate insulating layer 112. The fourth electrode CE4 may be provided to extend from the fourth semiconductor layer or the third semiconductor layer AO3. For instance, the fourth electrode CE4 may include an oxide semiconductor and may be arranged over the fourth interlayer insulating layer 114. A second gate insulating layer 113 and a fourth interlayer insulating layer 114 may be arranged between the third electrode CE3 and the fourth electrode CE4, and the second gate insulating layer 113 and the fourth interlayer insulating layer 114 may function as a dielectric layer of the second capacitor Cbt.

The fourth electrode CE4 of the second capacitor Cbt may be connected to the node connection line 166 to be electrically connected to the first gate electrode G1.

In the embodiment of FIG. 8, the first inorganic insulating layer IIL1 may include a first gate insulating layer 112, a second gate insulating layer 113, a fourth interlayer insulating layer 114, and a third gate insulating layer 115. A first hole DH1 passing through the first inorganic insulating layer IIL1 may be defined in the first inorganic insulating layer IIL1. In an embodiment, the first hole DH1 may be formed through the first gate insulating layer 112, the second gate insulating layer 113, the fourth interlayer insulating layer 114, and the third gate insulating layer 115.

The first hole DH1 may be formed in a boundary area BA of the first pixel area SPA1 and the second pixel area SPA2. Also, the first hole DH1 may be formed around the thin film transistor in each of the first pixel area SPA1 and the second pixel area SPA2. The first hole DH1 may correspond to an overlap of sub-holes 112a, 113a, 114a, and 115a of each of the first gate insulating layer 112, the second gate insulating layer 113, the fourth interlayer insulating layer 114, and the third gate insulating layer 115. Accordingly, the first inorganic insulating layer IIL1 including the first gate insulating layer 112, the second gate insulating layer 113, the fourth interlayer insulating layer 114, and the third gate insulating layer 115 may be understood as including the first hole DH1 in a boundary area BA between the first pixel area SPA1 and the second pixel area SPA2 adjacent to each other and/or in a peripheral portion of a thin film transistor.

The first organic insulating layer OIL1 may include a first interlayer insulating layer 117 over the first inorganic insulating layer IIL1. The first organic insulating layer OIL1 may be arranged to cover thin film transistors including an oxide semiconductor layer, such as the third thin film transistor T3 and the fourth thin film transistor T4; however, embodiments are not limited thereto. For instance, in another embodiment, the first organic insulating layer OIL1 may be arranged to contact a portion of the side surface thereof without being arranged over the first upper gate electrode G3b of the third thin film transistor T3 or the second upper gate electrode G4b of the fourth thin film transistor T4.

As illustrated in FIG. 8, the first organic insulating layer OIL1 may be arranged to cover the first inorganic insulating layer IIL1 and may fill the first hole DH1 formed in the first inorganic insulating layer IIL1. Accordingly, the first hole DH1 may be filled with an organic material.

The second inorganic insulating layer IIL2 may include a second interlayer insulating layer 118 over the first organic insulating layer OIL1.

In the embodiment of FIG. 8, a second hole DH2 passing through the second inorganic insulating layer IIL2 may be defined in the second inorganic insulating layer IIL2. The second hole DH2 may overlap the first hole DH1 formed in the first inorganic insulating layer IIL1.

The second organic insulating layer OIL2 may include a third interlayer insulating layer 119 over the second inorganic insulating layer IIL2. The second organic insulating layer OIL2 may fill the second hole DH2 formed in the second inorganic insulating layer IIL2. Accordingly, the second hole DH2 may be filled with an organic material.

The planarization layer 120 may be arranged over the second organic insulating layer OIL2 and may include an organic material, such as acryl, benzocyclobutene (BCB), polyimide, or hexamethyldisiloxane (HMDSO). Alternatively, the planarization layer 120 may include an inorganic material. The planarization layer 120 may function as a protection layer covering the thin film transistors T1 to T7, and an upper portion of the planarization layer 120 may be planarized. The planarization layer 120 may include a single layer or multiple layers. For example, the planarization layer 120 may include a first planarization layer 120a and a second planarization layer 120b.

In an embodiment, a data line DL (see FIG. 6), a power voltage line PL (see FIG. 6), a node connection line 166 (see FIG. 6), and connection electrodes connecting conductive layers arranged on different layers may be arranged over the second inorganic insulating layer IIL2. The node connection line 166 may be arranged between the third interlayer insulating layer 119 and the first planarization layer 120a, and the data line DL and the power voltage line PL may be arranged between the first planarization layer 120a and the second planarization layer 120b. The connection electrodes may be arranged between the third interlayer insulating layer 119 and the first planarization layer 120a and/or between the first planarization layer 120a and the second planarization layer 120b. The connection electrodes may also be arranged between the second interlayer insulating layer 118 and the third interlayer insulating layer 119.

The data line DL, the power voltage line PL, the node connection line 166, and the connection electrodes may include a high-conductivity material, such as a metal or a conductive oxide. For example, the data line DL, the power voltage line PL, the node connection line 166, and the connection electrodes may include a single layer or multiple layers including at least one of aluminum (Al), copper (Cu), titanium (Ti), and the like. In some embodiments, the data line DL, the power voltage line PL, the node connection line 166, and the connection electrodes may be provided as a triple layer of titanium, aluminum, and titanium (Ti/Al/Ti) sequentially arranged (e.g., stacked).

The display element layer DEL may be arranged over the pixel circuit layer PCL. The display element layer DEL may include a display element. As the display element, the organic light emitting diode OLED may include a pixel electrode 211, an intermediate layer 212, and an opposite electrode 213.

The organic light emitting diode OLED may include a first organic light emitting diode OLED1 electrically connected to the pixel circuit PC of the first pixel PX1 and a second organic light emitting diode OLED2 electrically connected to the pixel circuit PC of the second pixel PX2.

Figure 9A:
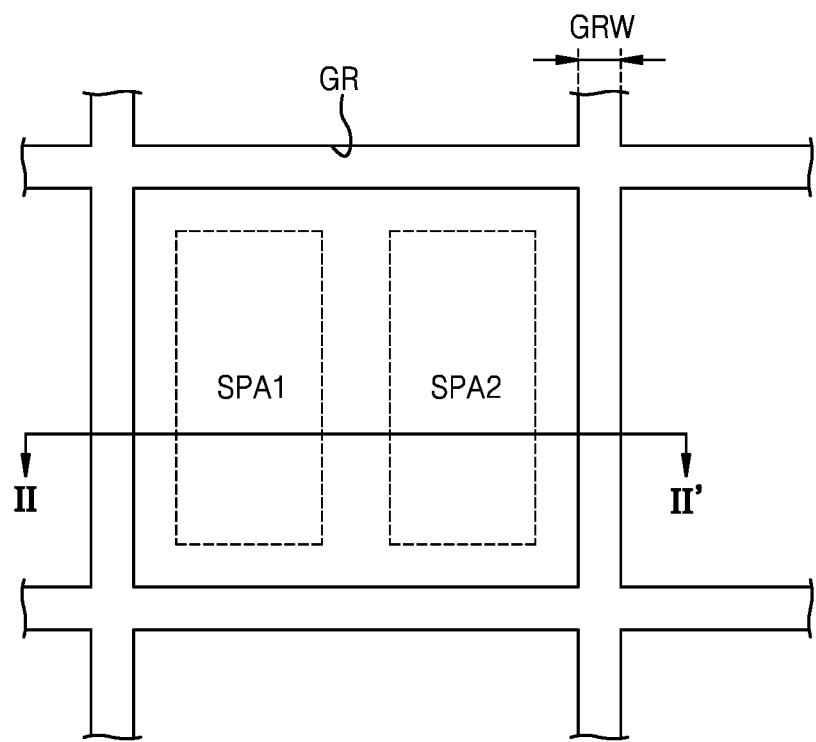
FIG. 9A is a plan view schematically illustrating a display apparatus according to an embodiment.
Figure 9B:
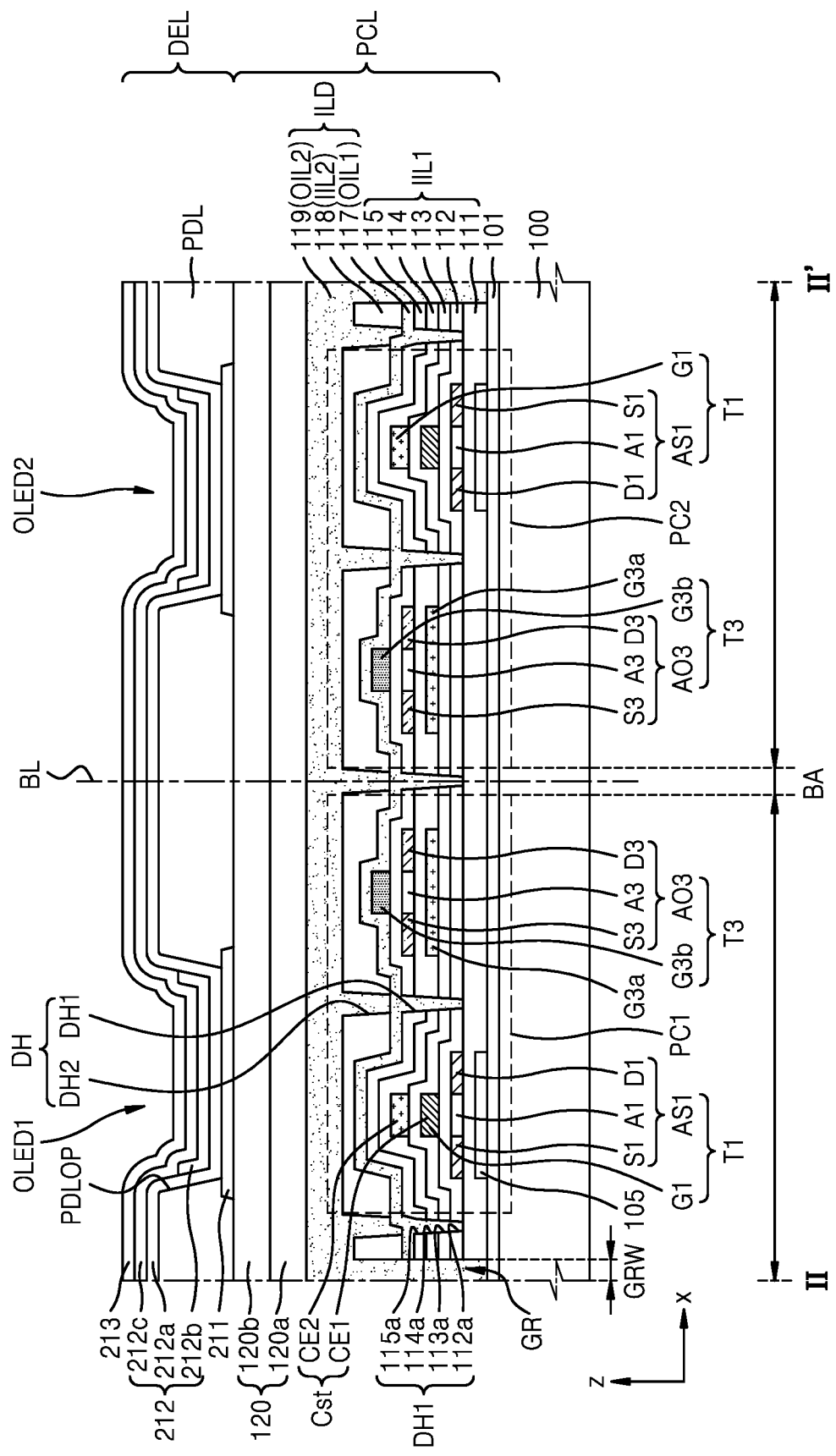
FIG. 9B is a cross-sectional view of the display apparatus of FIG. 9A taken along sectional line II-II' according to an embodiment.

FIG. 9A is a plan view schematically illustrating a display apparatus according to an embodiment. FIG. 9B is a cross-sectional view of the display apparatus of FIG. 9A taken along sectional line II-II' of FIG. 9A according to an embodiment. In FIGS. 9A and 9B, like reference numerals as those in FIGS. 7 and 8 denote like members, and thus, redundant descriptions will be omitted for conciseness.

Referring to FIG. 9A, the display apparatus according to an embodiment may further include a groove GR surrounding the pixel area. The groove GR may be filled with an organic material.

The groove GR may be arranged to group and surround a plurality of pixels. FIG. 9A illustrates that the groove GR is arranged to surround two adjacent pixels, e.g., the first pixel PX1 and the second pixel PX2. In another embodiment, the groove GR may be arranged to surround four pixels, e.g., pixels PX1, PX2, PX3, and PX4, and the number of grouped pixels may be variously modified.

The number of grouped pixels may be the same in one display apparatus or may be different according to positions. The groove GR may be formed only in a portion of the display area DA.

FIGS. 9A and 9B illustrate that the display apparatus further includes a groove GR or an opening formed through the first inorganic insulating layer IIL1, the first organic insulating layer OIL1, and the second inorganic insulating layer IIL2. The groove GR may be filled with an organic material, e.g., the organic material of the second organic insulating layer OIL2.

The barrier layer 101 may be continuous across the first pixel PX1 and the second pixel PX2 that are adjacent to each other. The buffer layer 111, the first gate insulating layer 112, the second gate insulating layer 113, the fourth interlayer insulating layer 114, the third gate insulating layer 115, the first organic insulating layer OIL1, and the second inorganic insulating layer IIL2 may include openings overlapping each other in an area between the pixel areas PXA. Accordingly, the substrate 100 or the barrier layer 101 may be formed to be exposed. However, the grooves GR may be formed in various shapes; for example, a portion of the upper surface of the barrier layer 101 may be removed, but the lower surface of the buffer layer 111 may remain without being removed.

A width GRW of the groove GR may be several µm. For example, the width GRW of the groove GR may have a value between about 5 µm and about 10 µm.

In FIG. 9B, the second organic insulating layer OIL2 may be arranged to cover the second inorganic insulating layer IIL2 and may fill the groove GR formed through the first inorganic insulating layer IIL1, the first organic insulating layer OIL1, and the second inorganic insulating layer IIL2. Accordingly, the groove GR may be filled with an organic material.

In the display apparatus according to some embodiments, the opening or the groove GR filled with an organic material and surrounding the pixel area may be introduced to minimize the influence of the external impact. Because the hardness of the inorganic insulating layer is higher than the hardness of the organic material layer, the probability of occurrence of a crack due to the external impact may be high, and when a crack occurs in the inorganic insulating layer, a crack may also occur in various signal lines arranged in or over the inorganic insulating layer, and thus, a defect such as disconnection may occur.

According to some embodiments, because an opening or groove GR surrounds the pixel area and an organic material layer fills the opening or groove GR, the probability of propagation of a crack may be low even when the external impact is great. Also, because the organic material layer with low hardness absorbs a stress caused by the external impact, it may be possible to prevent the stress from being concentrated on the inorganic insulating layer and the peripheral signal line.

Also, because the display apparatus according to some embodiments has the opening or the groove GR, even when the display area DA is folded or wound, the occurrence of a crack may be minimized and the organic material layer filling the opening or the groove GR may absorb a tensile stress caused by bending.

Figure 10:
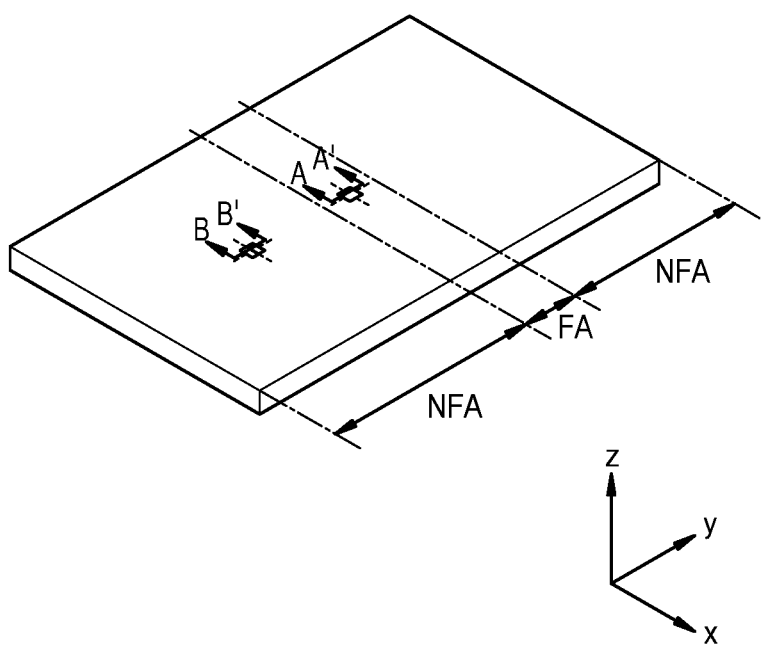
FIG. 10 is a perspective view schematically illustrating a foldable area and a non-foldable area of a display apparatus according to an embodiment.

FIG. 10 is a plan view schematically illustrating a foldable area and a non-foldable area of a display apparatus according to an embodiment. In FIG. 10, like reference numerals as those in FIGS. 1A, 1i, and 5 will denote like elements, and thus, redundant descriptions will be omitted for conciseness.

Referring to FIG. 10, the display apparatus may include a display area DA including a plurality of pixel areas PXA, and the display area DA may include a foldable area FA and a non-foldable area NFA.

The number of holes DH included in the same area in the foldable area FA and the non-foldable area NFA may be different from each other. For example, when a cross-section of a pixel PX included in the foldable area FA, which is taken along sectional line AA', is compared with a cross-section of a pixel PX included in the non-foldable area NFA, which is taken along sectional line B-B' in the same direction as sectional line A-A', the number of holes included in the foldable area FA may be greater than the number of holes included in the non-foldable area NFA.

The display apparatus according to an embodiment may be foldable or rollable. In this case, because the display apparatus is folded in the foldable area FA, the more external impact may be applied than in the non-foldable area NFA. The display apparatus according to an embodiment may minimize the influence of the external impact by including at least one hole DH formed through the inorganic insulating layer/organic insulating layer/inorganic insulating layer structure and filled with the organic material.

Also, by forming more holes in the foldable area FA than in the non-foldable area NFA, it may be possible to provide a flexible display apparatus that is flexible while being robust against the external impact.

According to an embodiment, a display apparatus may include at least one hole filled with an organic material in a boundary area between a plurality of pixels or in a peripheral portion of a thin film transistor, and thus, a high-resolution display apparatus that is flexible while being robust against an external impact may be implemented. However, the scope of the disclosure is not limited to these effects.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A display apparatus comprising:
   a substrate;
   a plurality of pixels disposed over the substrate, each pixel comprising a plurality of thin film transistors, each thin film transistor comprising a semiconductor layer and a gate electrode;
   a first inorganic insulating layer comprising a first insulating layer between the semiconductor layer and the gate electrode of the thin film transistor and a second insulating layer disposed over the gate electrode;
   a first organic insulating layer disposed over the first inorganic insulating layer;
   a second inorganic insulating layer disposed over the first organic insulating layer; and
   a second organic insulating layer disposed over the second inorganic insulating layer,
   wherein a plurality of holes pass through the first inorganic insulating layer and the second inorganic insulating layer, and
   the plurality of holes comprise:
      a first hole disposed between the plurality of pixels, and
      a second hole disposed between the plurality of thin film transistors of each pixel,
   wherein the plurality of holes are filled with an organic material.

2. The display apparatus of claim 1, wherein each of the plurality of holes comprises:
   a lower hole formed in the first inorganic insulating layer; and
   an upper hole formed in the second inorganic insulating layer, the upper hole overlapping the lower hole.

3. The display apparatus of claim 2, wherein:
   the first organic insulating layer fills the lower hole of the first inorganic insulating layer; and
   the second organic insulating layer fills the upper hole of the second inorganic insulating layer.

4. The display apparatus of claim 2, wherein the lower hole passes through the first insulating layer and the second insulating layer.

5. The display apparatus of claim 1, wherein the first organic insulating layer and the second organic insulating layer comprise a same material.

6. A display apparatus comprising:
   a substrate comprising pixel areas;
   a first-first thin film transistor and a first-second thin film transistor disposed over a first pixel area among the pixel areas, the first-first thin film transistor comprising a first-first semiconductor layer and a first-first gate electrode, the first-second thin film transistor comprising a first-second semiconductor layer and a first-second gate electrode;
   a second-first thin film transistor and a second-second thin film transistor disposed over a second pixel area adjacent to the first pixel area among the pixel areas, the second-first thin film transistor comprising a second-first semiconductor layer and a second-first gate electrode, the second-second thin film transistor comprising a second-second semiconductor layer and a second-second gate electrode;
   a first inorganic insulating layer disposed over the first-first gate electrode of the first-first thin film transistor, the first-second gate electrode of the first-second thin film transistor, the second-first gate electrode of the second-first thin film transistor, and the second-second gate electrode of the second-second thin film transistor;
   a first organic insulating layer disposed over the first inorganic insulating layer;
   a second inorganic insulating layer disposed over the first organic insulating layer; and
   a second organic insulating layer disposed over the second inorganic insulating layer,
   wherein a plurality of holes pass through the first inorganic insulating layer and the second inorganic insulating layer, and
   the plurality of holes comprise:
      a first hole is-disposed in a boundary area between the first pixel area and the second pixel area,
      a second hole is-disposed between the first-first thin film transistor and the first-second thin film transistor disposed over the first pixel area, and
      a third hole is disposed between the second-first thin film transistor and the second-second thin film transistor disposed over the second pixel area,
   wherein the plurality of holes are filled with an organic material.

7. The display apparatus of claim 6, wherein
   the second-first thin film transistor is symmetrical to the first-first thin film transistor, and
   the second-second thin film transistor is symmetrical to the first-second thin film transistor.

8. The display apparatus of claim 6, wherein each of the plurality of holes comprises:
   a lower hole formed in the first inorganic insulating layer; and
   an upper hole formed in the second inorganic insulating layer, the upper hole overlapping the lower hole.

9. The display apparatus of claim 8, wherein:
   the first organic insulating layer fills the lower hole of the first inorganic insulating layer; and
   the second organic insulating layer fills the upper hole of the second inorganic insulating layer.

10. The display apparatus of claim 8, wherein
    the first inorganic insulating layer comprises:
       a first insulating layer disposed between the first-first semiconductor layer and the first-first gate electrode of the first-first thin film transistor, between the first-second semiconductor layer and the first-second gate electrode of the first-second thin film transistor, between the second-first semiconductor layer and the second-first gate electrode of the second-first thin film transistor, and between the second-second semiconductor layer and the second-second gate electrode of the second-second thin film transistor, and
       a second insulating layer disposed over the first-first gate electrode, the first-second gate electrode, the second-first gate electrode and the second-second gate electrode, and
    the lower hole passes through the first insulating layer and the second insulating layer.

11. The display apparatus of claim 6, wherein the first organic insulating layer and the second organic insulating layer include a same material.

12. The display apparatus of claim 6, wherein at least one hole passing through the first inorganic insulating layer and the second inorganic insulating layer is further included in a peripheral portion of at least one of the first-first thin film transistor and the second-first thin film transistor.

13. The display apparatus of claim 6, wherein
the first-first semiconductor layer and the second-first semiconductor layer are silicon semiconductor layers; and
the first-second semiconductor layer and the second-second semiconductor layer are oxide semiconductor layers.

14. The display apparatus of claim 6, further comprising:
a groove surrounding the first pixel area and the second pixel area,
wherein the groove passes through the first inorganic insulating layer, the first organic insulating layer, and the second inorganic insulating layer, and
wherein the groove is filled with an organic material.

15. The display apparatus of claim 14, wherein the second organic insulating layer fills the groove.

16. The display apparatus of claim 6, further comprising:
a first display element disposed over the second organic insulating layer, the first display element being connected to the first-second thin film transistor; and
a second display element disposed over the second organic insulating layer, the second display element being connected to the second-second thin film transistor.

17. The display apparatus of claim 6, further comprising:
a display area comprising the pixel areas,
wherein the display area is at least one of foldable and rollable.

18. The display apparatus of claim 17, wherein the display area comprises:
a foldable area; and
a non-foldable area, and
a number of the plurality of holes in the foldable area is greater than a number of the plurality of holes in the non-foldable area.

* * * * *